United States Patent
Liu et al.

(10) Patent No.: US 11,342,904 B1
(45) Date of Patent: May 24, 2022

(54) D FLIP-FLOP

(71) Applicant: FARADAY TECHNOLOGY CORPORATION, Hsinchu (TW)

(72) Inventors: Yu-Hao Liu, Hsinchu (TW); Sheng-Hua Chen, Hsinchu (TW); Cheng-Hsing Chien, Hsinchu (TW)

(73) Assignee: FARADAY TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/184,640

(22) Filed: Feb. 25, 2021

(30) Foreign Application Priority Data

Dec. 3, 2020 (TW) .................................. 109142660

(51) Int. Cl.
*H03K 3/012* (2006.01)
*H03K 3/356* (2006.01)

(52) U.S. Cl.
CPC ....... *H03K 3/356104* (2013.01); *H03K 3/012* (2013.01)

(58) Field of Classification Search
CPC .......... H03K 3/012; H03K 3/356104–356121; H03K 3/35625
See application file for complete search history.

(56) References Cited

U.S. PATENT DOCUMENTS

| | | | |
|---|---|---|---|
| 6,448,831 B1 | 9/2002 | Hunt, Jr. et al. | |
| 6,680,638 B2 * | 1/2004 | Kim | H03K 19/0963 327/210 |
| 7,583,123 B2 | 9/2009 | Kanda et al. | |
| 9,924,466 B1 * | 3/2018 | Leuciuc | H04W 52/029 |

FOREIGN PATENT DOCUMENTS

JP  2006203479 A * 8/2006
KR  100667041 B1 * 1/2010

OTHER PUBLICATIONS

Yuan Ji-Ren et al., "A True Single-Phase-Clock Dynamic CMOS Circuit Technique", Oct. 1987, pp. 899-901, vol. SC-22, No. 5, IEEE Journal of Solid-State Circuits.
Jiren Yuan et al., "High-speed CMOS Circuit Technique", Feb. 1989, pp. 62-70, vol. 24. No. 1., IEEE Journal of Solid-State Circuits.
Office Action issued by Taiwan Intellectual Property Office dated Jul. 30, 2021.

* cited by examiner

*Primary Examiner* — Patrick O Neill
(74) *Attorney, Agent, or Firm* — WPAT, PC

(57) ABSTRACT

A true single-phase clock (TSPC) D flip-flop includes four stages. The four stages are serially connected between the input terminal and the output terminal of the TSPC D-type flip-flop. Each stage is selectively equipped with two connecting devices. One of the two connecting devices is a resistive element. The other of the two connecting devices is a short circuit element. When the node between two stages is in the floating state, the voltage change is slowed down by the resistive element. Consequently, the possibility of causing the function failure of the D-type flip-flop is minimized.

5 Claims, 12 Drawing Sheets

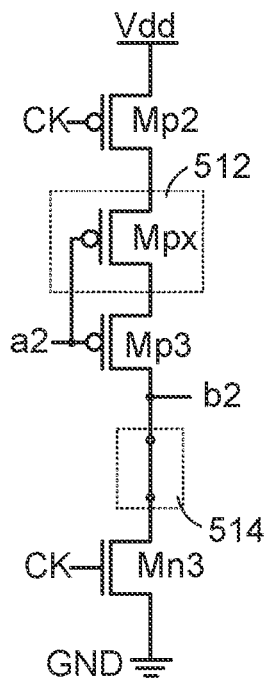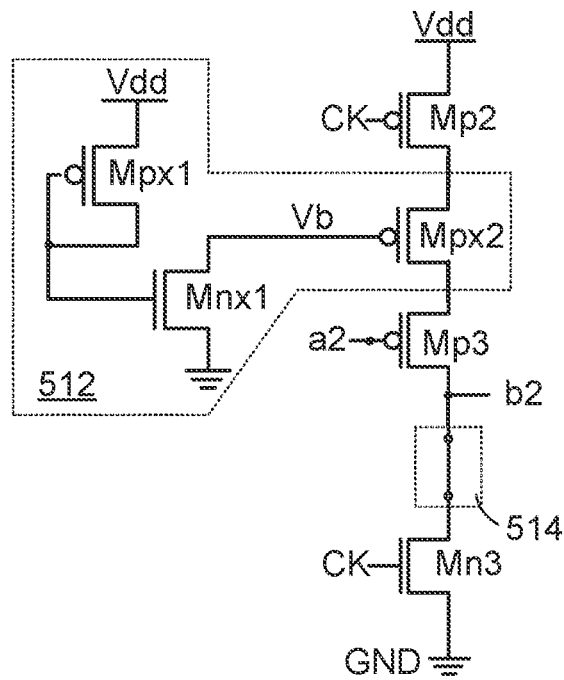
FIG. 6A  FIG. 6B
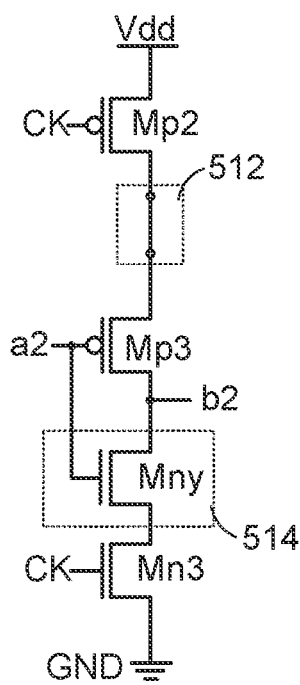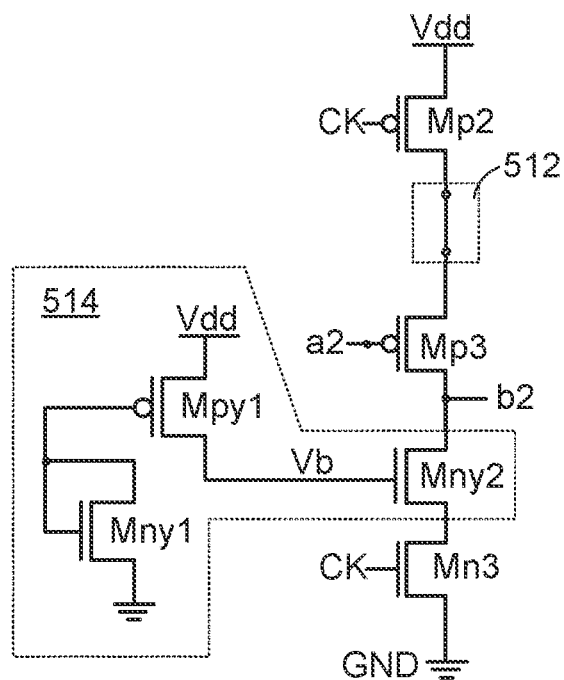
FIG. 6C  FIG. 6D

D FLIP-FLOP

This application claims the benefit of Taiwan Patent Application No. 109142660, filed Dec. 3, 2020, the subject matter of which is incorporated herein by reference.

FIELD OF THE INVENTION

The present invention relates to a D flip-flop, and more particularly to a true single-phase clock D flip-flop.

BACKGROUND OF THE INVENTION

Generally, the D-type flip-flops in logic circuits are all master-slave type D flip-flops. The master-slave D-type flip-flop has better anti-noise capability. However, the master-slave D-type flip-flop has some drawbacks, including larger size, slower operation speed and higher power consumption.

In an integrated circuit, a dynamic circuit is operated according to a clock signal. A true single-phase clock D flip-flop (hereinafter referred to as a TSPC D flip-flop) is a kind of dynamic circuit. Since dynamic circuits have the advantages of higher speed, low layout area, and low power consumption, dynamic circuits have been designed in logic circuits or special application integrated circuits (ASICs).

SUMMARY OF THE INVENTION

An embodiment of the present invention provides a D-type flip-flop. The D-type flip-flop includes a first connecting device, a first first-type transistor, a first second-type transistor, a second second-type transistor, a second connecting device, a second first-type transistor, a third first-type transistor, a third second-type transistor, a fourth first-type transistor, a fifth first-type transistor and a fourth second-type transistor. The first connecting device has a first terminal and a second terminal. The first terminal of the first connecting device receives a first supply voltage. The first first-type transistor has a gate terminal, a first drain/source terminal, and a second drain/source terminal. The gate terminal of the first first-type transistor receives an input signal. The first drain/source terminal of the first first-type transistor is connected with the second terminal of the first connecting device. The second drain/source terminal of the first first-type transistor is connected to a first node. The first second-type transistor has a gate terminal, a first drain/source terminal and a second drain/source terminal. The gate terminal of the first second-type transistor receives a clock signal. The first drain/source terminal of the first second-type transistor is connected to the first node. The second second-type transistor has a gate terminal, a first drain/source terminal and a second drain/source terminal. The gate terminal of the second second-type transistor receives the input signal. The first drain/source terminal of the second second-type transistor is connected with the second drain/source terminal of the first second-type transistor. The second connecting device has a first terminal and a second terminal. The first terminal of the second connecting device is connected with the second drain/source terminal of the second second-type transistor. The second terminal of the second connecting device receives a second supply voltage. The second first-type transistor has a gate terminal, a first drain/source terminal and a second drain/source terminal. The gate terminal of the second first-type transistor receives the clock signal. The first drain/source terminal of the second first-type transistor receives the first supply voltage. The third first-type transistor has a gate terminal, a first drain/source terminal and a second drain/source terminal. The gate terminal of the third first-type transistor is connected to the first node. The first drain/source terminal of the third first-type transistor is connected with the second drain/source terminal of the second first-type transistor. The second drain/source terminal of the third first-type transistor is coupled to a second node. The third second-type transistor has a gate terminal, a first drain/source terminal and a second drain/source terminal. The gate terminal of the third second-type transistor receives the clock signal. The first drain/source terminal of the third second-type transistor is coupled to the second node. The second drain/source terminal of the third second-type transistor receives the second supply voltage. The fourth first-type transistor has a gate terminal, a first drain/source terminal and a second drain/source terminal. The gate terminal of the fourth first-type transistor is connected to the second node. The first drain/source terminal of the fourth first-type transistor is coupled to the first supply voltage. The fifth first-type transistor has a gate terminal, a first drain/source terminal and a second drain/source terminal. The gate terminal of the fifth first-type transistor receives the clock signal. The first drain/source terminal of the fifth first-type transistor is connected with the second drain/source terminal of the fourth first-type transistor. The second drain/source terminal of the fifth first-type transistor is connected to a third node. The fourth second-type transistor has a gate terminal, a first drain/source terminal and a second drain/source terminal. The gate terminal of the fourth second-type transistor is connected to the second node. The first drain/source terminal of the fourth second-type transistor is connected to the third node. The second drain/source terminal of the fourth second-type transistor is coupled to the second supply voltage. Moreover, one of the first connecting device and the second connecting device is a resistive element, and the other of the first connecting device and the second connecting device is a short circuit element.

Another embodiment of the present invention provides a D-type flip-flop. The D-type flip-flop includes a first first-type transistor, a first second-type transistor, a second second-type transistor, a second first-type transistor, a first connecting device, a third first-type transistor, a second connecting device, a third second-type transistor, a fourth first-type transistor, a fifth first-type transistor and a fourth second-type transistor. The first first-type transistor has a gate terminal, a first drain/source terminal, and a second drain/source terminal. The gate terminal of the first first-type transistor receives an input signal. The first drain/source terminal of the first first-type transistor receives a first supply voltage. The second drain/source terminal of the first first-type transistor is connected to a first node. The first second-type transistor has a gate terminal, a first drain/source terminal and a second drain/source terminal. The gate terminal of the first second-type transistor receives a clock signal. The first drain/source terminal of the first second-type transistor is connected to the first node. The second second-type transistor has a gate terminal, a first drain/source terminal and a second drain/source terminal. The gate terminal of the second second-type transistor receives the input signal. The first drain/source terminal of the second second-type transistor is connected with the second drain/source terminal of the first second-type transistor. The second drain/source terminal of the second second-type transistor receives a second supply voltage. The second first-type transistor has a gate terminal, a first drain/source terminal and a second drain/source terminal. The gate terminal of the second first-type transistor receives the clock signal. The first drain/source terminal of the second first-type transistor receives the first supply voltage. The first connecting device has a first terminal and a second terminal. The first terminal of the first connecting device is connected with the second drain/source terminal of the second first-type transistor. The third first-type transistor has a gate terminal, a first drain/source terminal and a second drain/source terminal. The gate terminal of the third first-type transistor is connected to the first node. The first drain/source terminal of the third first-type transistor is connected with the second terminal of the first connecting device. The second drain/source terminal of the third first-type transistor is coupled to a second node. The second connecting device has a first terminal and a second terminal. The first terminal of the second connecting device is connected to the second node. The third second-type transistor has a gate terminal, a first drain/source terminal and a second drain/source terminal. The gate terminal of the third second-type transistor receives the clock signal. The first drain/source terminal of the third second-type transistor is connected with the second terminal of the second connecting device. The second drain/source terminal of the third second-type transistor receives the second supply voltage. The fourth first-type transistor has a gate terminal, a first drain/source terminal and a second drain/source terminal. The gate terminal of the fourth first-type transistor is connected to the second node. The first drain/source terminal of the fourth first-type transistor is coupled to the first supply voltage. The fifth first-type transistor has a gate terminal, a first drain/source terminal and a second drain/source terminal. The gate terminal of the fifth first-type transistor receives the clock signal. The first drain/source terminal of the fifth first-type transistor is connected with the second drain/source terminal of the fourth first-type transistor. The second drain/source terminal of the fifth first-type transistor is connected to a third node. The fourth second-type transistor has a gate terminal, a first drain/source terminal and a second drain/source terminal. The gate terminal of the fourth second-type transistor is connected to the second node. The first drain/source terminal of the fourth second-type transistor is connected to the third node. The second drain/source terminal of the fourth second-type transistor is coupled to the second supply voltage. Moreover, one of the first connecting device and the second connecting device is a resistive element, and the other of the first connecting device and the second connecting device is a short circuit element.

Another embodiment of the present invention provides a D-type flip-flop. The D-type flip-flop includes a first first-type transistor, a first second-type transistor, a second second-type transistor, a second first-type transistor, a third first-type transistor, a third second-type transistor, a first connecting device, a fourth first-type transistor, a fifth first-type transistor, a fourth second-type transistor and a second connecting device. The first first-type transistor has a gate terminal, a first drain/source terminal, and a second drain/source terminal. The gate terminal of the first first-type transistor receives an input signal. The first drain/source terminal of the first first-type transistor receives a first supply voltage. The second drain/source terminal of the first first-type transistor is connected to a first node. The first second-type transistor has a gate terminal, a first drain/source terminal and a second drain/source terminal. The gate terminal of the first second-type transistor receives a clock signal. The first drain/source terminal of the first second-type transistor is connected to the first node. The second second-type transistor has a gate terminal, a first drain/source terminal and a second drain/source terminal. The gate terminal of the second second-type transistor receives the input signal. The first drain/source terminal of the second second-type transistor is connected with the second drain/source terminal of the first second-type transistor. The second drain/source terminal of the second second-type transistor receives a second supply voltage. The second first-type transistor has a gate terminal, a first drain/source terminal and a second drain/source terminal. The gate terminal of the second first-type transistor receives the clock signal. The first drain/source terminal of the second first-type transistor receives the first supply voltage. The third first-type transistor has a gate terminal, a first drain/source terminal and a second drain/source terminal. The gate terminal of the third first-type transistor is connected to the first node. The first drain/source terminal of the third first-type transistor is connected with the second drain/source terminal of the second first-type transistor. The second drain/source terminal of the third first-type transistor is connected to a second node. The third second-type transistor has a gate terminal, a first drain/source terminal and a second drain/source terminal. The gate terminal of the third second-type transistor receives the clock signal. The first drain/source terminal of the third second-type transistor is connected to the second node. The second drain/source terminal of the third second-type transistor receives the second supply voltage. The first connecting device has a first terminal and a second terminal. The first terminal of the first connecting device receives the first supply voltage. The fourth first-type transistor has a gate terminal, a first drain/source terminal and a second drain/source terminal. The gate terminal of the fourth first-type transistor is connected to the second node. The first drain/source terminal of the fourth first-type transistor is connected to the second terminal of the first connecting device. The fifth first-type transistor has a gate terminal, a first drain/source terminal and a second drain/source terminal. The gate terminal of the fifth first-type transistor receives the clock signal. The first drain/source terminal of the fifth first-type transistor is connected with the second drain/source terminal of the fourth first-type transistor. The second drain/source terminal of the fifth first-type transistor is connected to a third node. The fourth second-type transistor has a gate terminal, a first drain/source terminal and a second drain/source terminal. The gate terminal of the fourth second-type transistor is connected to the second node. The first drain/source terminal of the fourth second-type transistor is connected to the third node. The second connecting device has a first terminal and a second terminal. The first terminal of the second connecting device is connected with the second drain/source terminal of the fourth second-type transistor. The second terminal of the second connecting device receives the second supply voltage. Moreover, one of the first connecting device and the second connecting device is a resistive element, and the other of the first connecting device and the second connecting device is a short circuit element.

Another embodiment of the present invention provides a D-type flip-flop. The D-type flip-flop includes a first first-type transistor, a first second-type transistor, a second second-type transistor, a second first-type transistor, a third first-type transistor, a third second-type transistor, a fourth first-type transistor, a fifth first-type transistor, a fourth second-type transistor and a first capacitor. The first first-type transistor has a gate terminal, a first drain/source terminal, and a second drain/source terminal. The gate terminal of the first first-type transistor receives an input signal. The first drain/source terminal of the first first-type transistor receives a first supply voltage. The second drain/ source terminal of the first first-type transistor is connected to a first node. The first second-type transistor has a gate terminal, a first drain/source terminal and a second drain/source terminal. The gate terminal of the first second-type transistor receives a clock signal. The first drain/source terminal of the first second-type transistor is connected to the first node. The second second-type transistor has a gate terminal, a first drain/source terminal and a second drain/source terminal. The gate terminal of the second second-type transistor receives the input signal. The first drain/source terminal of the second second-type transistor is connected with the second drain/source terminal of the first second-type transistor. The second drain/source terminal of the second second-type transistor receives a second supply voltage. The second first-type transistor has a gate terminal, a first drain/source terminal and a second drain/source terminal. The gate terminal of the second first-type transistor receives the clock signal. The first drain/source terminal of the second first-type transistor receives the first supply voltage. The third first-type transistor has a gate terminal, a first drain/source terminal and a second drain/source terminal. The gate terminal of the third first-type transistor is connected to the first node. The first drain/source terminal of the third first-type transistor is connected with the second drain/source terminal of the second first-type transistor. The second drain/source terminal of the third first-type transistor is connected to a second node. The third second-type transistor has a gate terminal, a first drain/source terminal and a second drain/source terminal. The gate terminal of the third second-type transistor receives the clock signal. The first drain/source terminal of the third second-type transistor is connected to the second node. The second drain/source terminal of the third second-type transistor receives the second supply voltage. The fourth first-type transistor has a gate terminal, a first drain/source terminal and a second drain/source terminal. The gate terminal of the fourth first-type transistor is connected to the second node. The first drain/source terminal of the fourth first-type transistor receives the first supply voltage. The fifth first-type transistor has a gate terminal, a first drain/source terminal and a second drain/source terminal. The gate terminal of the fifth first-type transistor receives the clock signal. The first drain/source terminal of the fifth first-type transistor is connected with the second drain/source terminal of the fourth first-type transistor. The second drain/source terminal of the fifth first-type transistor is connected to a third node. The fourth second-type transistor has a gate terminal, a first drain/source terminal and a second drain/source terminal. The gate terminal of the fourth second-type transistor is connected to the second node. The first drain/source terminal of the fourth second-type transistor is connected to the third node. The second drain/source terminal of the fourth second-type transistor receives the second supply voltage. The first capacitor has a first terminal and a second terminal. The first terminal of the first capacitor is connected to the first node. The second terminal of the first capacitor receives the first supply voltage or the second supply voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 6A, 6B, 6C and 6D schematically illustrate some examples of the resistive element used in the D flip-flop according to the second embodiment of the present invention;

DETAILED DESCRIPTION OF PREFERRED EMBODIMENTS

Figure 1A:
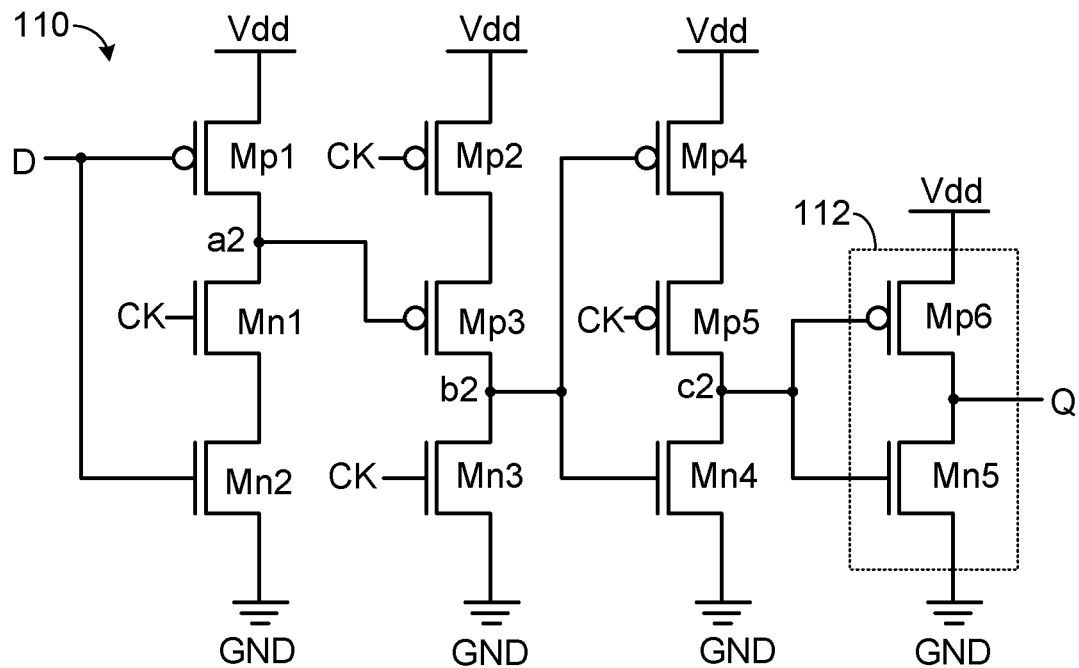
FIG. 1A is a schematic circuit diagram illustrating a negative trigger TSPC D flip-flop.
Figure 1B:
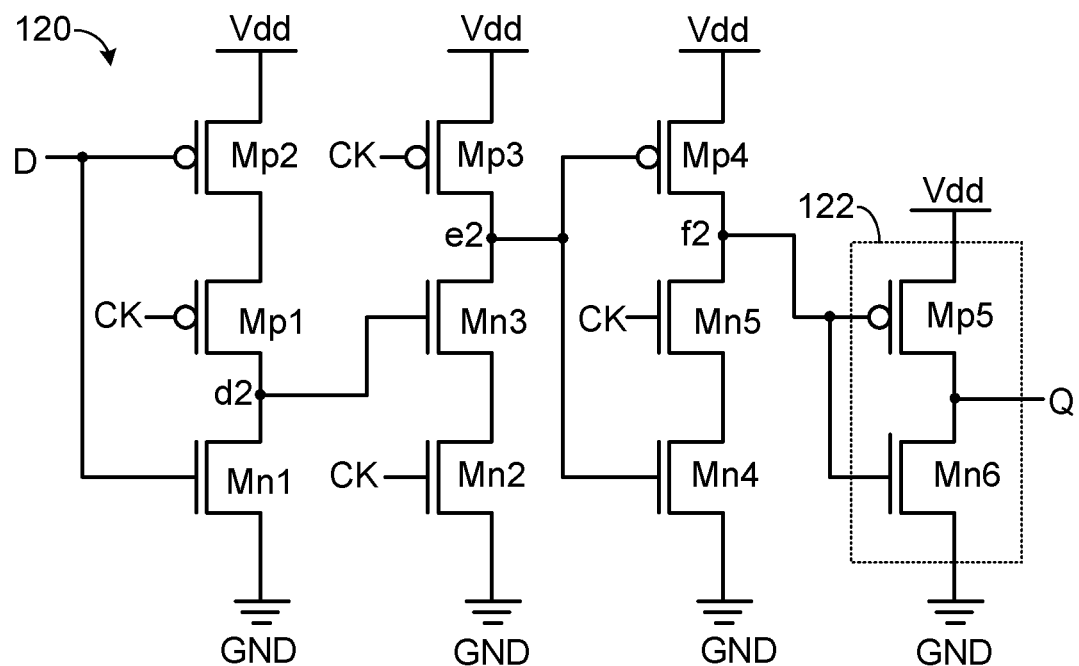
FIG. 1B is a schematic circuit diagram illustrating a positive trigger TSPC D flip-flop.

Please refer to FIGS. 1A and 1B. FIG. 1A is a schematic circuit diagram illustrating a negative trigger TSPC D flip-flop. FIG. 1B is a schematic circuit diagram illustrating a positive trigger TSPC D flip-flop.

As shown in FIG. 1A, the negative trigger TSPC D-type flip-flop 110 comprises p-type transistors Mp1~Mp6 and n-type transistors Mn1~Mn5. The p-type transistor and the n-type transistor are different types of transistors. For example, the p-type transistors are first-type transistors, and the n-type transistors are second-type transistors.

Moreover, four stages are serially connected between the input terminal and the output terminal of the negative trigger TSPC D-type flip-flop 110. The first stage comprises the p-type transistor Mp1 and the two n-type transistors Mn1, Mn2. The second stage comprises the P-type transistors Mp2, Mp3 and the n-type transistor Mn3. The third stage comprises the p-type transistor Mp4, Mp5 and the n-type transistor Mn4. The fourth stage comprises the p-type transistor Mp6 and the n-type transistor Mn5.

The connecting relationship between associated components of the first stage will be described as follows. The gate terminal of the p-type transistor Mp1 receives an input signal D. The first drain/source terminal of the p-type transistor Mp1 receives a supply voltage Vdd. The second drain/source terminal of the p-type transistor Mp1 is connected to node a2. The gate terminal of the n-type transistor Mn1 receives a clock signal CK. The first drain/source terminal of the n-type transistor Mn1 is connected to the node a2. The gate terminal of the n-type transistor Mn2 receives the input signal D. The first drain/source terminal of the n-type transistor Mn2 is connected with the second drain/source terminal of the n-type transistor Mn1. The second drain/source terminal of the n-type transistor Mn2 receives a supply voltage GND. The supply voltage Vdd is higher than the supply voltage GND. For example, the supply voltage Vdd is 3.3V, and the supply voltage GND is 0V.

The connecting relationship between associated components of the second stage will be described as follows. The gate terminal of the p-type transistor Mp2 receives the clock signal CK. The first drain/source terminal of the p-type transistor Mp2 receives the supply voltage Vdd. The gate terminal of the p-type transistor Mp3 is connected to the node a2. The first drain/source terminal of the p-type transistor Mp3 is connected with the second drain/source terminal of the p-type transistor Mp2. The second drain/source terminal of the p-type transistor Mp3 is connected to a node b2. The gate terminal of the n-type transistor Mn3 receives the clock signal CK. The first drain/source terminal of the n-type transistor Mn3 is connected to the node b2. The second drain/source terminal of the n-type transistor Mn3 receives the supply voltage GND.

The connecting relationship between associated components of the third stage will be described as follows. The gate terminal of the p-type transistor Mp4 is connected to the node b2. The first drain/source terminal of the p-type transistor Mp4 receives the supply voltage Vdd. The gate terminal of the p-type transistor Mp5 receives the clock signal CK. The first drain/source terminal of the p-type transistor Mp5 is connected with the second drain/source terminal of the p-type transistor Mp4. The second drain/source terminal of the p-type transistor Mp5 is connected to a node c2. The gate terminal of the n-type transistor Mn4 is connected to the node b2. The first drain/source terminal of the n-type transistor Mn4 is connected to the node c2. The second drain/source terminal of the n-type transistor Mn4 receives the supply voltage GND.

The connecting relationship between associated components of the fourth stage will be described as follows. The p-type transistor Mp6 and the n-type transistor Mn5 are collaboratively formed as an inverter 112. The input terminal of the inverter 112 is connected to the node c2. The output terminal of the inverter 112 generates an output signal Q. The gate terminal of the p-type transistor Mp6 is connected to the node c2. The first drain/source terminal of the p-type transistor Mp6 receives the supply voltage Vdd. The second drain/source terminal of the p-type transistor Mp6 generates the output signal Q. The gate terminal of the n-type transistor Mn5 is connected to node c2. The first drain/source terminal of the n-type transistor Mn5 is connected with the second drain/source terminal of the p-type transistor Mp6. The second drain/source terminal of the n-type transistor Mn5 receives the supply voltage GND.

As shown in FIG. 1B, the positive trigger TSPC D-type flip-flop 120 comprises n-type transistors Mn1~Mn6 and p-type transistors Mp1~Mp5. The p-type transistor and the n-type transistor are different types of transistors. For example, the n-type transistors are first-type transistors, and the p-type transistors are second-type transistors.

Moreover, four stages are serially connected between the input terminal and the output terminal of the positive trigger TSPC D-type flip-flop 120. The first stage comprises the p-type transistors Mp1, Mp2 and the n-type transistors Mn1. The second stage comprises the p-type transistors Mp3 and the n-type transistors Mn2, Mn3. The third stage comprises the p-type transistors Mp4 and the n-type transistors Mn4, Mn5. The fourth stage comprises the p-type transistor Mp5 and the n-type transistor Mn6.

The connecting relationship between associated components of the first stage will be described as follows. The gate terminal of the n-type transistor Mn1 receives an input signal D. The first drain/source terminal of the n-type transistor Mn1 receives a supply voltage GND. The second drain/source terminal of the n-type transistor Mn1 is connected to the node d2. The gate terminal of the p-type transistor Mp1 receives the clock signal CK. The first drain/source terminal of the p-type transistor Mp1 is connected to the node d2. The gate terminal of the p-type transistor Mp2 receives the input signal D. The first drain/source terminal of the p-type transistor Mp2 is connected with the second drain/source terminal of the p-type transistor Mp1. The second drain/source terminal of the p-type transistor Mp2 receives the supply voltage Vdd. The supply voltage Vdd is higher than the supply voltage GND. For example, the supply voltage Vdd is 3.3V, and the supply voltage GND is 0V.

The connecting relationship between associated components of the second stage will be described as follows. The gate terminal of the n-type transistor Mn2 receives the clock signal CK. The first drain/source terminal of the n-type transistor Mn2 receives the supply voltage GND. The gate terminal of the n-type transistor Mn3 is connected to the node d2. The first drain/source terminal of the n-type transistor Mn3 is connected with the second drain/source terminal of the n-type transistor Mn2. The second drain/source terminal of the n-type transistor Mn3 is connected to the node e2. The gate terminal of the p-type transistor Mp3 receives the clock signal CK. The first drain/source terminal of the p-type transistor Mp3 is connected to the node e2. The second drain/source terminal of the p-type transistor Mp3 receives the supply voltage Vdd.

The connecting relationship between associated components of the third stage will be described as follows. The gate terminal of the n-type transistor Mn4 is connected to the node e2. The first drain/source terminal of the n-type transistor Mn4 receives the supply voltage GND. The gate terminal of the n-type transistor Mn5 receives the clock signal CK. The first drain/source terminal of the n-type transistor Mn5 is connected with the second drain/source terminal of the n-type transistor Mn4. The second drain/source terminal of the n-type transistor Mn5 is connected to a node f2. The gate terminal of the p-type transistor Mp4 is connected to the node e2. The first drain/source terminal of the p-type transistor Mp4 is connected with the node f2. The second drain/source terminal of the p-type transistor Mp4 receives the supply voltage Vdd.

The connecting relationship between associated components of the fourth stage will be described as follows. The p-type transistor Mp5 and the n-type transistor Mn6 are collaboratively formed as an inverter 122. The input terminal of the inverter 122 is connected to the node f2. The output terminal of the inverter 122 generates an output signal Q. The gate terminal of the n-type transistor Mn6 is connected to the node f2. The first drain/source terminal of the n-type transistor Mn6 receives the supply voltage GND. The second drain/source terminal of the n-type transistor Mn6 generates the output signal Q. The gate terminal of the p-type transistor Mp5 is connected to node f2. The first drain/source terminal of the p-type transistor Mp5 is connected with the second drain/source terminal of the n-type transistor Mn6. The second drain/source terminal of the p-type transistor Mp5 receives the supply voltage Vdd.

Figure 2A:
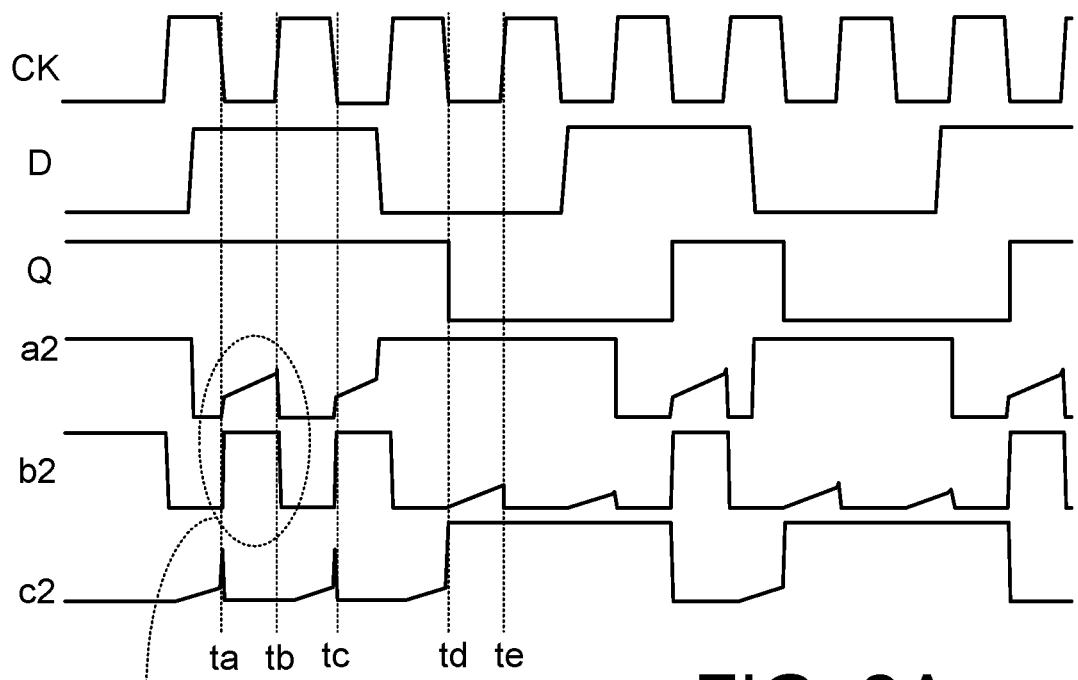
FIGS. 2A and 2B are schematic timing waveform diagrams illustrating associated signals of the negative trigger TSPC D-type flip-flop.
Figure 2B:
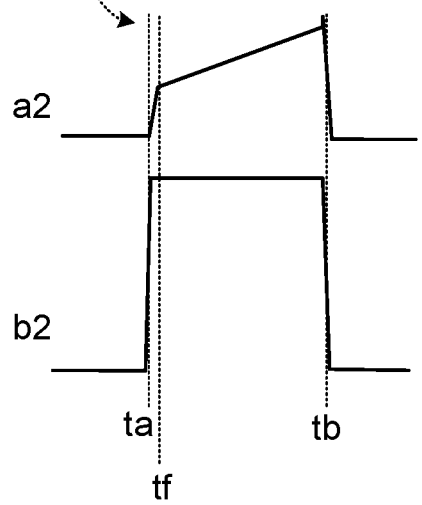

The operations of the positive trigger TSPC D-type flip-flop 120 are similar to those of the negative trigger TSPC D-type flip-flop 110. For brevity, only the operations of the negative trigger TSPC D-type flip-flop 110 when the nodes a2, b2 and c2 are in the floating state will be described as follows. FIGS. 2A and 2B are schematic timing waveform diagrams illustrating associated signals of the negative trigger TSPC D-type flip-flop.

In the time interval between the time point to and the time point tb, the clock signal CK is in a low level state (e.g., corresponding to the supply voltage GND), and the input signal D is in a high level state (e.g., corresponding to the supply voltage Vdd). The p-type transistor Mp1 and the n-type transistor Mn1 are turned off. Consequently, the node a2 is in the floating state. When the node a2 is in the floating state, the node a2 needs to be maintained in the low level state. However, since the p-type transistor Mp1 has a relatively large leakage current and the leakage current charges the node a2, the voltage at the node a2 is gradually increased. If the voltage at the node a2 is increased to be very high when the node a2 is in the floating state, the p-type transistor Mp2 is turned off. Consequently, the function of the D-type flip-flop 110 fails.

In the time interval between the time point td and the time point te, the voltage at the node a2 is at the high level state, and the clock signal CK is in the low level state. The p-type transistor Mp3 and the n-type transistor Mn3 are turned off. Consequently, the node b2 is in the floating state. Theoretically, when the node b2 is in the floating state, the node b2 needs to be maintained in the low level state. However, since the p-type transistors Mp2 and Mp3 have a relatively large leakage currents and the leakage currents charge the node b2, the voltage at the node b2 is gradually increased. If the voltage at the node b2 is increased to be very high when the node b2 is in the floating state, the p-type transistor Mp4 is turned off and the n-type transistor Mn4 is turned on. Consequently, the function of the D-type flip-flop 110 fails.

In the time interval between the time point tb and the time point tc, the voltage at the node b2 is at the low level state, and the clock signal CK is in the high level state. The n-type transistor Mn4 and the p-type transistor Mp5 are turned off. Consequently, the node c2 is in the floating state. Theoretically, when the node c2 is in the floating state, the node c2 needs to be maintained in the low level state. However, since the p-type transistors Mp4 and Mp5 have a relatively large leakage currents and the leakage currents charge the node c2, the voltage at the node c2 is gradually increased. If the voltage at the node c2 is increased to be very high when the node c2 is in the floating state, the p-type transistor Mp6 is turned off and the n-type transistor Mn5 is turned on. Consequently, the function of the D-type flip-flop 110 fails.

In FIG. 2B, the detailed waveform diagram of the associated signals at the node a2 is shown. At the time point ta, the clock signal CK is changed from the high level state to the low level state. The p-type transistor Mp2 is turned on, and the n-type transistor Mn3 is turned off. Consequently, the node b2 is changed from the low level state to the high level state. In the time interval between the time point ta to the time point tf, the voltage at the node b2 is increased because of the Miller effect. Consequently, the voltage at the node a2 is rapidly boosted from the low level state. Then, in the time interval between the time point tf to the time point tb, the leakage current of the p-type transistor Mp1 charges node a2 because the node a2 is in the floating state. Consequently, the voltage at the node a2 is gradually increased.

Moreover, the b2 and the node c2 are not affected by the Miller effect. The voltages at the node b2 and the node c2 are affected by the leakage current only.

Generally, the transistor with a larger size has a stronger driving strength and generates a larger leakage current.

As mentioned above, if the p-type transistors in the TSPC D-type flip-flops 110 and 120 have the stronger driving strength, the p-type transistors generate the larger leakage currents. Consequently, when the nodes of the TSPC D-type flip-flops 110 and 120 are in the floating state, the voltages at the nodes are gradually charged to the supply voltage Vdd. Similarly, if the n-type transistors in the TSPC D-type flip-flops 110 and 120 have the stronger driving strength, the n-type transistors generate the larger leakage currents. Consequently, when the nodes of the TSPC D-type flip-flops 110 and 120 are in the floating state, the voltages at the nodes are gradually charged to the supply voltage GND.

However, the TSPC D-type flip-flops 110 and 120 are inevitably affected by the leakage currents of the transistors. For preventing from the function failure of the TSPC D-type flip-flops 110 and 120, the TSPC D-type flip-flops are designed according to the purpose of reducing the leakage currents of the transistors. Hereinafter, the negative trigger TSPC D-type flip-flop will be taken as an example. Of course, the associated technologies can be applied to the positive trigger TSPC D-type flip-flop.

Figure 3A:
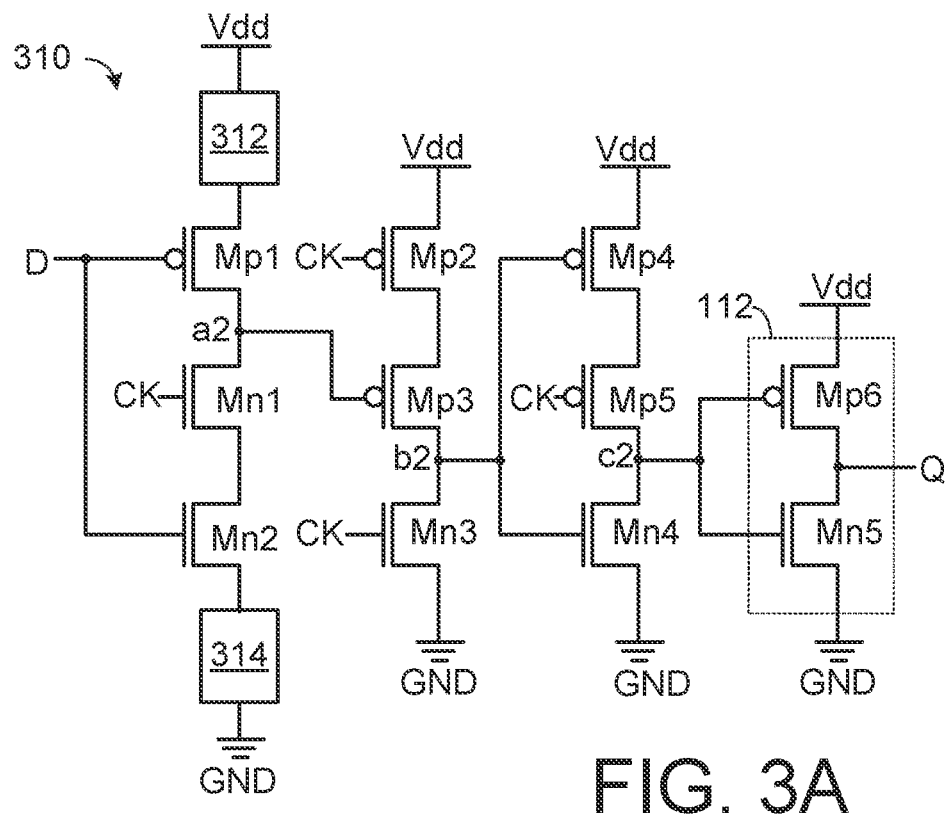
FIGS. 3A, 3B and 3C are schematic circuit diagrams illustrating a TSPC D flip-flop according to a first embodiment of the present invention.
Figure 3B:
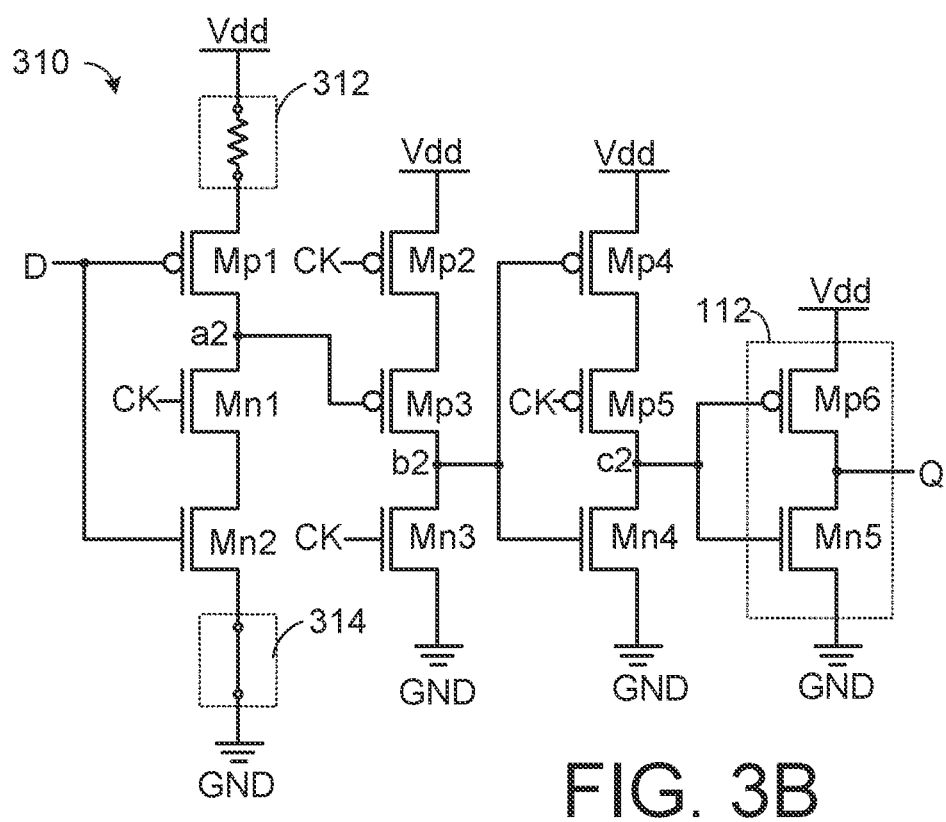
Figure 3C:
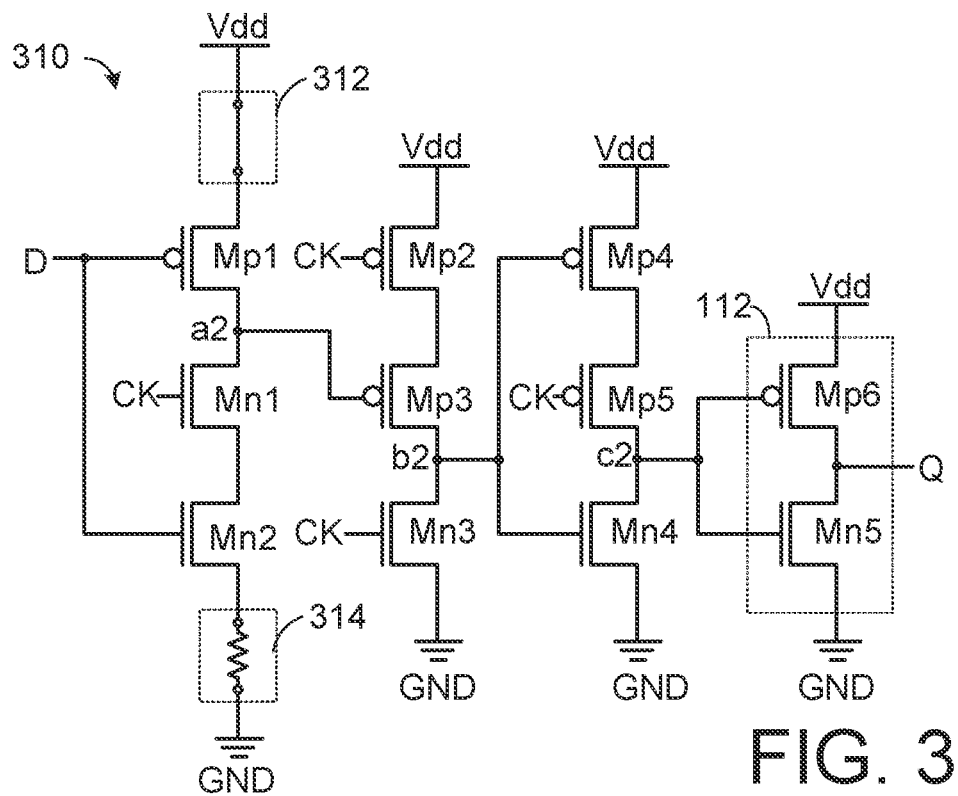

FIGS. 3A, 3B and 3C are schematic circuit diagrams illustrating a TSPC D flip-flop according to a first embodiment of the present invention. In comparison with the negative trigger TSPC D-type flip-flop of FIG. 1A, the first stage of the TSPC D flip-flop 310 of this embodiment further comprises two connecting devices 312 and 314. For succinctness, only the relationships between the connecting devices 312, 314 and associated components will be described as follows.

As shown in FIG. 3A, the connecting device 312 of the D-type flip-flop 310 has a first terminal and a second terminal. The first terminal of the connecting device 312 receives the supply voltage Vdd. The second terminal of the connecting device 312 is connected with the first drain/source terminal of the p-type transistor Mp1. The connecting device 314 has a first terminal and a second terminal. The first terminal of the connecting device 314 is connected with the second drain/source terminal of the n-type transistor Mn2. The second terminal of the connecting device 314 receives the supply voltage GND. In an embodiment, one of the two connecting devices 312, 314 is a resistive element, and the other of the two connecting devices 312, 314 is a short circuit element.

In the D flip-flop 310 of this embodiment, the two connecting devices 312 and 314 are designed according to the driving strengths of the p-type transistors and the n-type transistors.

Please refer to FIG. 3B. In the D-type flip-flop 310, the driving strength of the p-type transistor Mp1 is designed to be stronger than the driving strength of the n-type transistors Mn1 and Mn2. Under this circumstance, the connecting device 312 is a resistive element, and the connecting device 314 is a short circuit element. That is, a charging path between the supply voltage Vdd and the node a2 includes the resistive element. Consequently, when the node a2 is in the floating state, the leakage current of the p-type transistor Mp1 can be reduced. Since the voltage rise of the node a2 is slowed down, the D-type flip-flop 310 can be operated correctly.

Please refer to FIG. 3C. In the D-type flip-flop 310, the driving strength of the p-type transistor Mp1 is designed to be weaker than the driving strength of the n-type transistors Mn1 and Mn2. Under this circumstance, the connecting device 312 is a short circuit element, and the connecting device 314 is a resistive element.

In an embodiment, the short circuit element is implemented with a metal wire, and the resistive element is a polysilicon resistor or any other appropriate electronic component. Some examples will be described as follows.

FIGS. 4A, 4B, 4C and 4D schematically illustrate some examples of the resistive element used in the D flip-flop according to the first embodiment of the present invention.

Figures 4A, 4B:
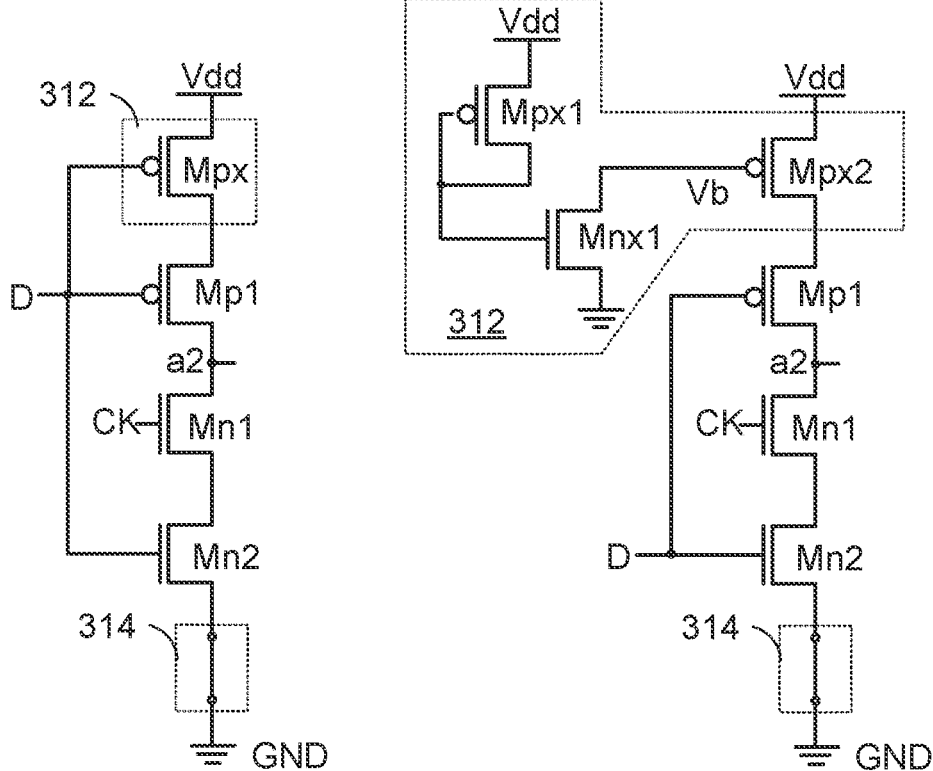
FIGS. 4A, 4B, 4C and 4D schematically illustrate some examples of the resistive element used in the D flip-flop according to the first embodiment of the present invention.

Please refer to FIG. 4A. In the first stage, the connecting device 312 in the charging path between the supply voltage Vdd and the node a2 comprises a p-type transistor Mpx. The gate terminal of the p-type transistor Mpx receives the input signal D. The first drain/source terminal of the p-type transistor Mpx receives the supply voltage Vdd. The second drain/source terminal of the p-type transistor Mpx is connected with the first drain/source terminal of the p-type transistor Mp1.

Please refer to FIG. 4B. In the first stage, the connecting device 312 in the charging path between the supply voltage Vdd and the node a2 comprises P-type transistors Mpx1, Mpx2 and an n-type transistor Mnx1. The p-type transistor Mpx1 and the n-type transistor Mnx1 are collaboratively formed as a bias circuit to provide a bias voltage Vb to the gate terminal of the p-type transistor Mpx2. The first drain/source terminal of the p-type transistor Mpx1 receives the supply voltage Vdd. The gate terminal of the p-type transistor Mpx1 and the second drain/source terminal of the p-type transistor Mpx1 are connected with each other. The gate terminal of the n-type transistor Mnx1 is connected with the gate terminal of the p-type transistor Mpx1. The first drain/source terminal of the n-type transistor Mnx1 generates the bias voltage Vb. The second drain/source terminal of the n-type transistor Mnx1 receives the supply voltage GND. The gate terminal of the p-type transistor Mpx2 receives the bias voltage Vb. The first drain/source terminal of the p-type transistor Mpx2 receives the supply voltage Vdd. The second drain/source terminal of the p-type transistor Mpx2 is connected with the first drain/source terminal of the p-type transistor Mp1.

Figure 4C:
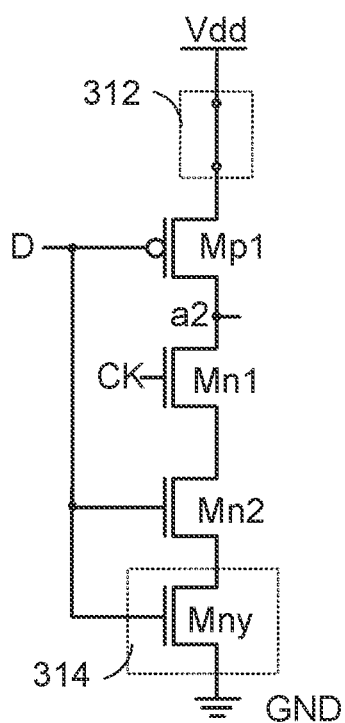

Please refer to FIG. 4C. In the first stage, the connecting device 314 in the discharging path between the node a2 and the supply voltage GND comprises an n-type transistor Mny. The gate terminal of the n-type transistor Mny receives the input signal D. The first drain/source terminal of the n-type transistor Mny is connected with the second drain/source terminal of the n-type transistor Mn2. The second drain/source terminal of the n-type transistor Mny receives the supply voltage GND.

Figure 4D:
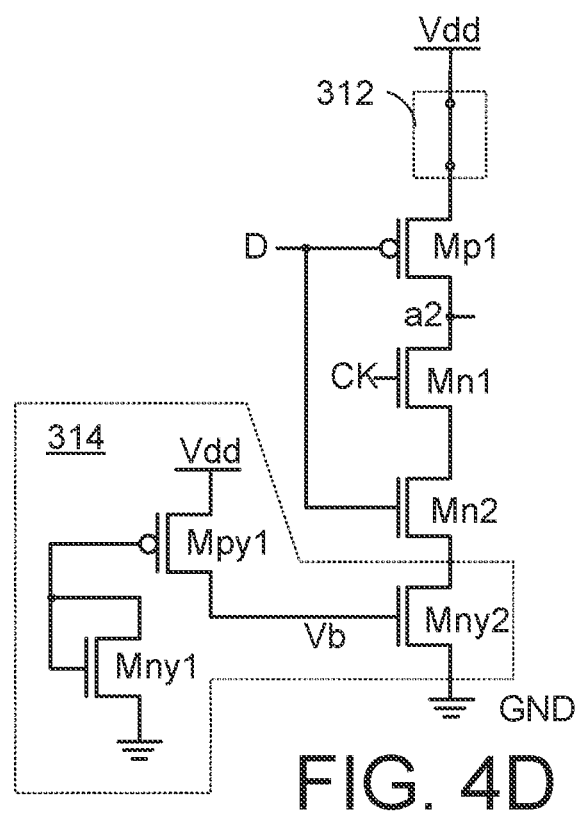

Please refer to FIG. 4D. In the first stage, the connecting device 314 in the discharging path between the node a2 and the supply voltage GND comprises n-type transistor Mny1, Mny2 and a p-type transistor Mpy1. The p-type transistor Mpy1 and the n-type transistor Mny1 are collaboratively formed as a bias circuit for providing a bias voltage Vb to the gate terminal of the n-type transistor Mny2. The first drain/source terminal of the p-type transistor Mpy1 receives the supply voltage Vdd. The second drain/source terminal of the p-type transistor Mpy1 generates the bias voltage Vb. The gate terminal of the n-type transistor Mny1 is connected with the gate terminal of the p-type transistor Mpy1. The gate terminal of the n-type transistor Mny1 and the first drain/source terminal of the n-type transistor Mny1 are connected with each other. The second drain/source terminal of the n-type transistor Mny1 receives the supply voltage GND. The gate terminal of the n-type transistor Mny2 receives the bias voltage Vb. The first drain/source terminal of the n-type transistor Mny2 is connected with the second drain/source terminal of the n-type transistor Mn2. The second drain/source terminal of the n-type transistor Mny2 receives the supply voltage GND.

Figure 5A:
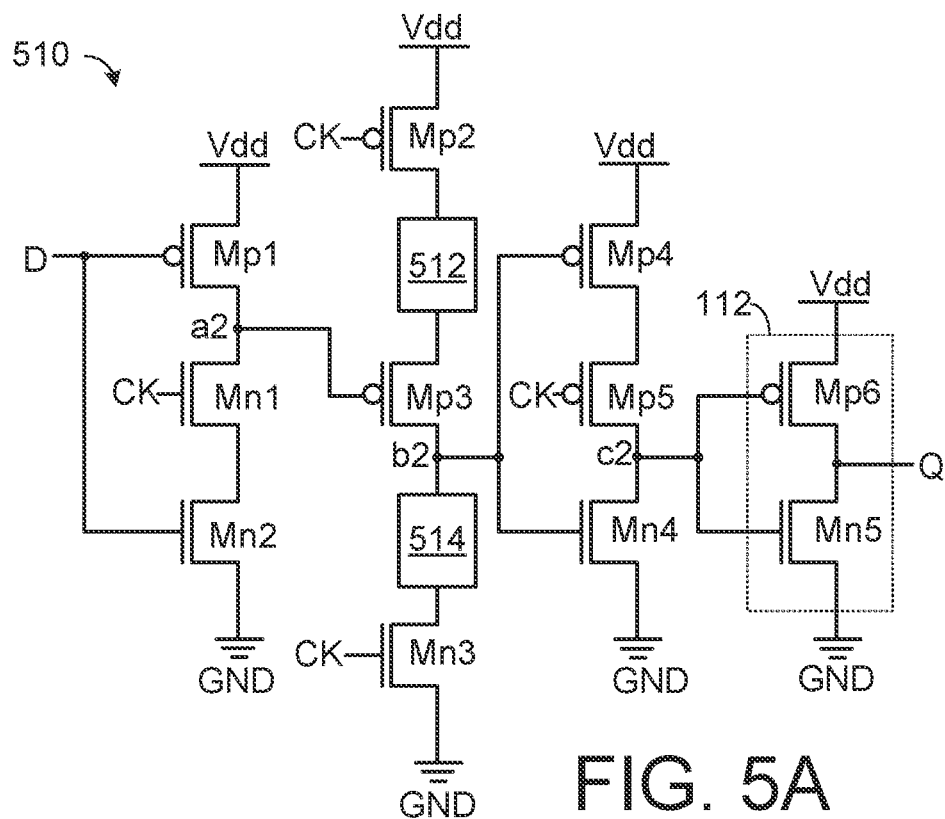
FIGS. 5A, 5B and 5C are schematic circuit diagrams illustrating a TSPC D flip-flop according to a second embodiment of the present invention.
Figure 5B:
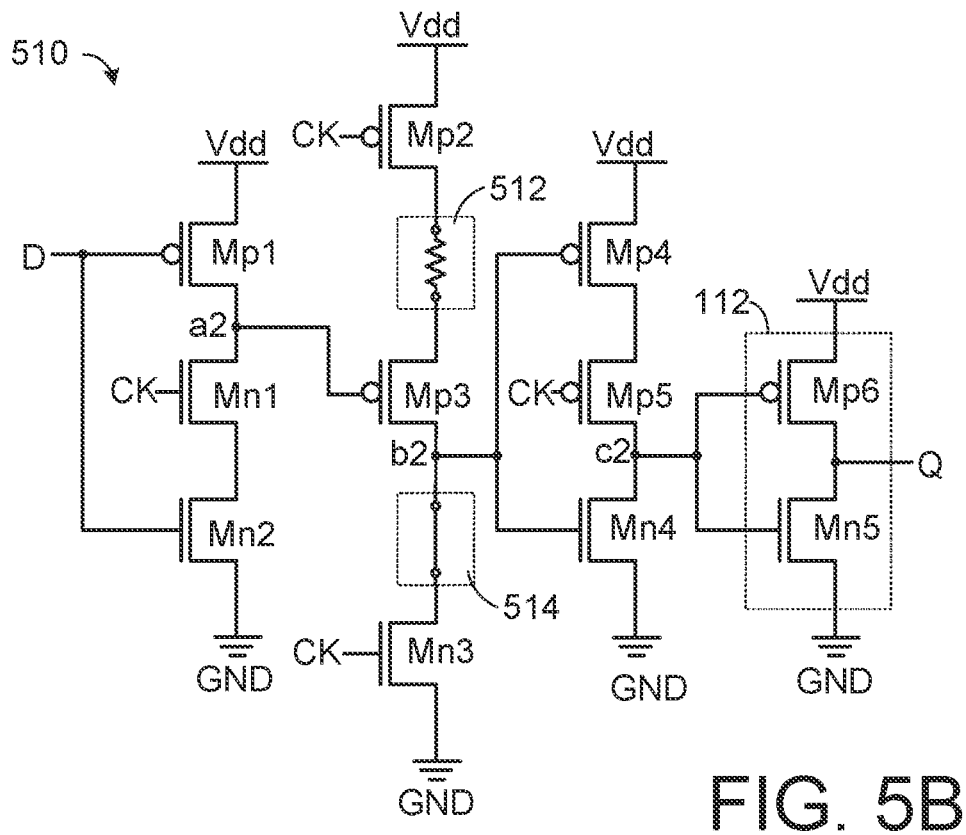
Figure 5C:
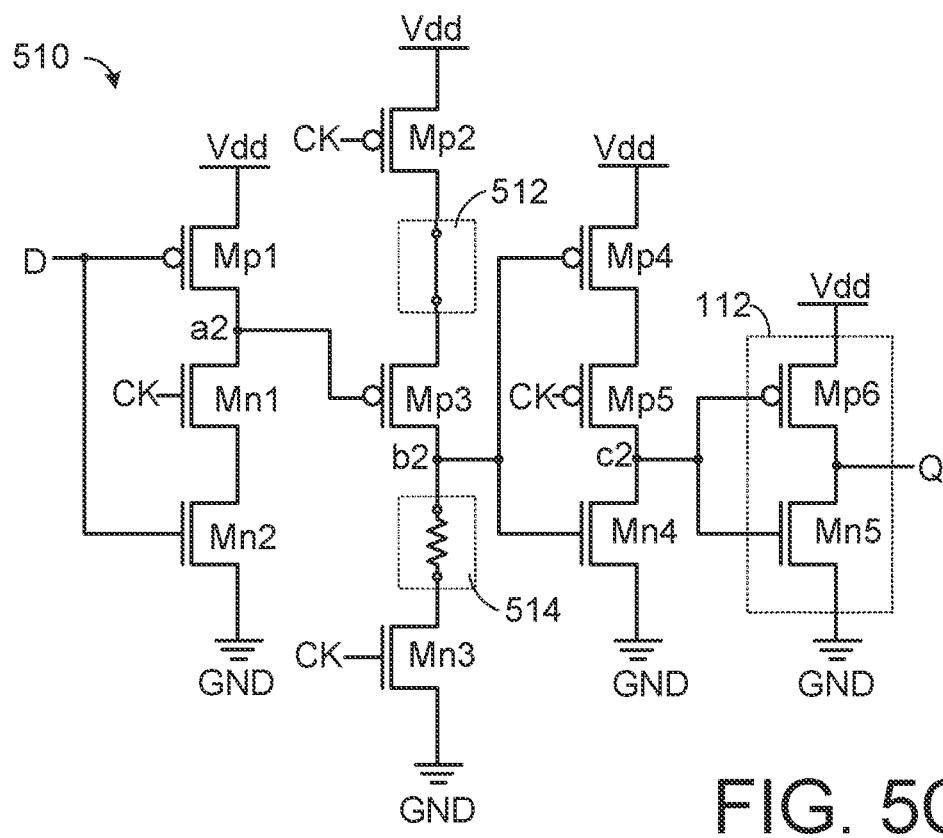

FIGS. 5A, 5B and 5C are schematic circuit diagrams illustrating a TSPC D flip-flop according to a second embodiment of the present invention. In comparison with the negative trigger TSPC D-type flip-flop 110 of FIG. 1A, the second stage of the TSPC D flip-flop 510 of this embodiment further comprises two connecting devices 512 and 514. For succinctness, only the relationships between the connecting devices 512, 514 and associated components will be described as follows.

The connecting device 512 of the D-type flip-flop 510 has a first terminal and a second terminal. The first terminal of the connecting device 512 is connected with the second drain/source terminal of the p-type transistor Mp2. The second terminal of the connecting device 512 is connected with the first drain/source terminal of the p-type transistor Mp3. The connecting device 514 has a first terminal and a second terminal. The first terminal of the connecting device 514 is connected to the node b2. The second terminal of the connecting device 514 is connected with the first drain/source terminal of the n-type transistor Mn3. In an embodiment, one of the two connecting devices 512, 514 is a resistive element, and the other of the two connecting devices 512, 514 is a short circuit element.

In the D flip-flop 510 of this embodiment, the two connecting devices 512 and 514 are designed according to the driving strengths of the p-type transistors and the n-type transistors.

Please refer to FIG. 5B. In the D-type flip-flop 510, the driving strength of the p-type transistors Mp2 and Mp3 is designed to be stronger than the driving strength of the n-type transistor Mn3. Under this circumstance, the connecting device 512 is a resistive element, and the connecting device 514 is a short circuit element. That is, a charging path between the supply voltage Vdd and the node b2 includes the resistive element. Consequently, when the node b2 is in the floating state, the leakage currents of the p-type transistors Mp2 and Mp3 can be reduced. Since the voltage rise of the node b2 is slowed down, the D-type flip-flop 510 can be operated correctly.

Please refer to FIG. 5C. In the D-type flip-flop 510, the driving strength of the p-type transistors Mp2 and Mp3 is designed to be weaker than the driving strength of the n-type transistor Mn3. Under this circumstance, the connecting device 512 is a short circuit element, and the connecting device 514 is a resistive element.

In an embodiment, the short circuit element is implemented with a metal wire, and the resistive element is a polysilicon resistor or any other appropriate electronic component. Some examples will be described as follows.

FIGS. 6A, 6B, 6C and 6D schematically illustrate some examples of the resistive element used in the D flip-flop according to the second embodiment of the present invention.

Please refer to FIG. 6A. In the second stage, the connecting device 512 in the charging path between the supply voltage Vdd and the node b2 comprises a p-type transistor Mpx. The gate terminal of the p-type transistor Mpx is connected to node a2. The first drain/source terminal of the p-type transistor Mpx is connected with the second drain/source terminal of the p-type transistor Mp2. The second drain/source terminal of the p-type transistor Mpx is connected with the first drain/source terminal of the p-type transistor Mp3.

Please refer to FIG. 6B. In the second stage, the connecting device 512 in the charging path between the supply voltage Vdd and the node b2 comprises p-type transistors Mpx1, Mpx2 and an n-type transistor Mnx1. The p-type transistor Mpx1 and the n-type transistor Mnx1 are collaboratively formed as a bias circuit to provide a bias voltage Vb to the gate terminal of the p-type transistor Mpx2. The first drain/source terminal of the p-type transistor Mpx1 receives the supply voltage Vdd. The gate terminal of the p-type transistor Mpx1 and the second drain/source terminal of the p-type transistor Mpx1 are connected with each other. The gate terminal of the n-type transistor Mnx1 is connected with the gate terminal of the p-type transistor Mpx1. The first drain/source terminal of the n-type transistor Mnx1 generates the bias voltage Vb. The second drain/source terminal of the n-type transistor Mnx1 receives the supply voltage GND. The gate terminal of the p-type transistor Mpx2 receives the bias voltage Vb. The first drain/source terminal of the p-type transistor Mpx2 is connected with the second drain/source terminal of the p-type transistor Mp2. The second drain/source terminal of the p-type transistor Mpx2 is connected with the second drain/source terminal of the p-type transistor Mp3.

Please refer to FIG. 6C. In the second stage, the connecting device 514 in the discharging path between the node b2 and the supply voltage GND comprises an n-type transistor Mny. The gate terminal of the n-type transistor Mny is connected with the node a2. The first drain/source terminal of the n-type transistor Mny is connected to the node b2. The second drain/source terminal of the n-type transistor Mny is connected with the first drain/source terminal of the n-type transistor Mn3.

Please refer to FIG. 6D. In the second stage, the connecting device 514 in the discharging path between the node b2 and the supply voltage GND comprises n-type transistor Mny1, Mny2 and a p-type transistor Mpy1. The p-type transistor Mpy1 and the n-type transistor Mny1 are collaboratively formed as a bias circuit for providing a bias voltage Vb to the gate terminal of the n-type transistor Mny2. The first drain/source terminal of the p-type transistor Mpy1 receives the supply voltage Vdd. The second drain/source terminal of the p-type transistor Mpy1 generates the bias voltage Vb. The gate terminal of the n-type transistor Mny1 is connected with the gate terminal of the p-type transistor Mpy1. The gate terminal of the n-type transistor Mny1 and the first drain/source terminal of the n-type transistor Mny1 are connected with each other. The second drain/source terminal of the n-type transistor Mny1 receives the supply voltage GND. The gate terminal of the n-type transistor Mny2 receives the bias voltage Vb. The first drain/source terminal of the n-type transistor Mny2 is connected to the node b2. The second drain/source terminal of the n-type transistor Mny2 is connected with the first drain/source terminal of the n-type transistor Mn3.

Figure 7A:
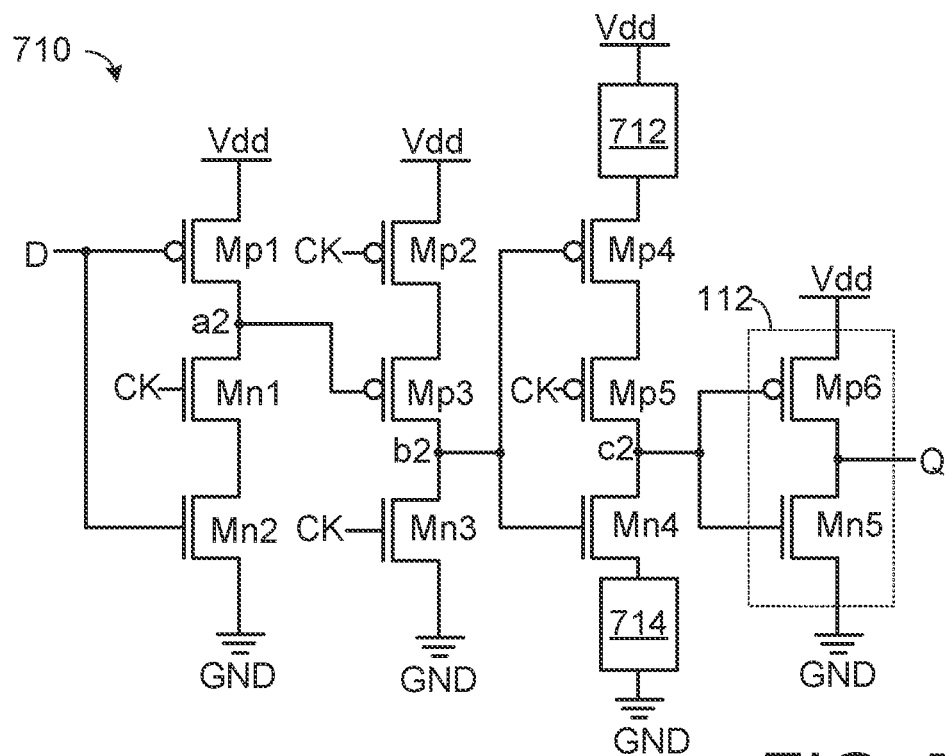
FIGS. 7A, 7B and 7C are schematic circuit diagrams illustrating a TSPC D flip-flop according to a third embodiment of the present invention.
Figure 7B:
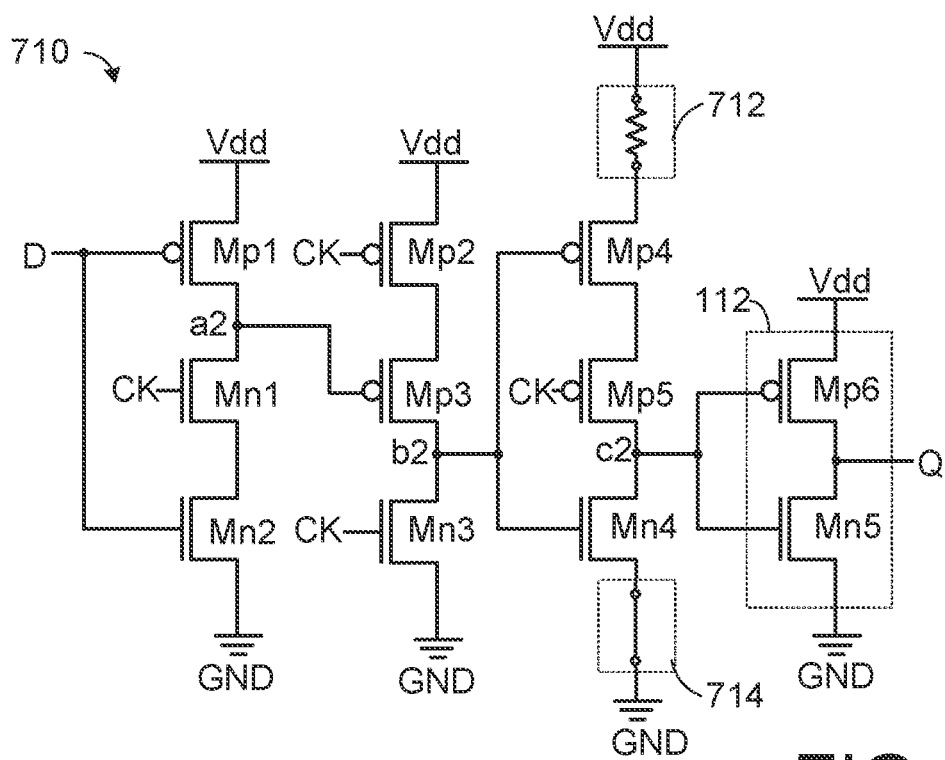
Figure 7C:
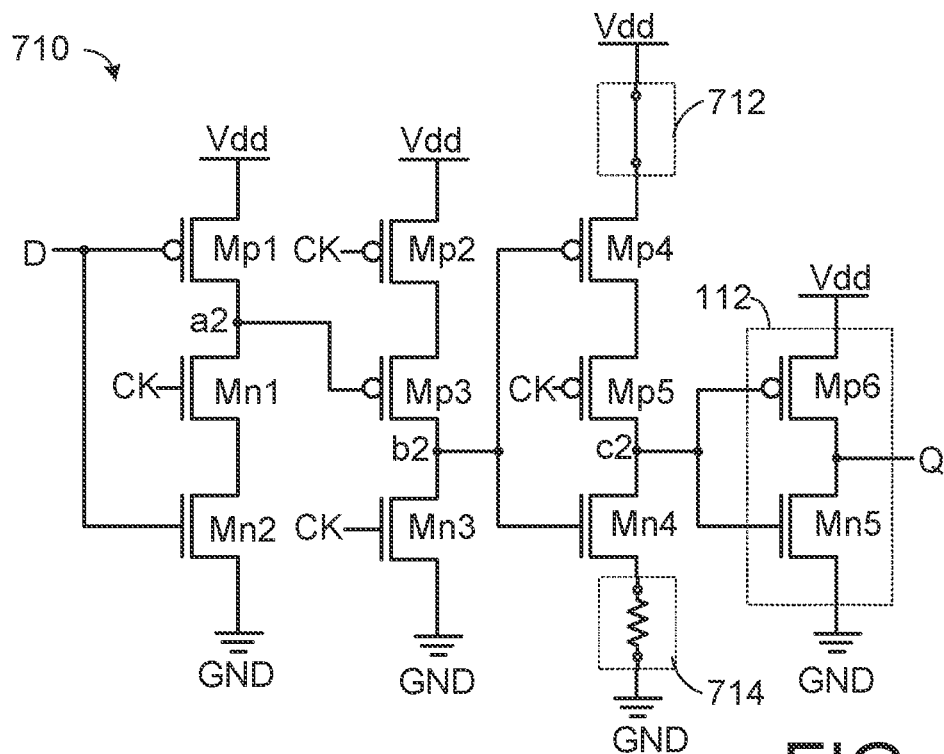

FIGS. 7A, 7B and 7C are schematic circuit diagrams illustrating a TSPC D flip-flop according to a third embodiment of the present invention. In comparison with the negative trigger TSPC D-type flip-flop 110 of FIG. 1A, the third stage of the TSPC D flip-flop 710 of this embodiment further comprises two connecting devices 712 and 714. For succinctness, only the relationships between the connecting devices 712, 714 and associated components will be described as follows.

As shown in FIG. 7A, the connecting device 712 of the D-type flip-flop 710 has a first terminal and a second terminal. The first terminal of the connecting device 712 receives the supply voltage Vdd. The second terminal of the connecting device 712 is connected with the first drain/source terminal of the p-type transistor Mp4. The connecting device 714 has a first terminal and a second terminal. The first terminal of the connecting device 714 is connected with the second drain/source terminal of the n-type transistor Mn4. The second terminal of the connecting device 714 receives the supply voltage GND. In an embodiment, one of the two connecting devices 712, 714 is a resistive element, and the other of the two connecting devices 712, 714 is a short circuit element.

In the D flip-flop 710 of this embodiment, the two connecting devices 712 and 714 are designed according to the driving strengths of the p-type transistors and the n-type transistors.

Please refer to FIG. 7B. In the D-type flip-flop 710, the driving strength of the p-type transistors Mp4 and Mp5 is designed to be stronger than the driving strength of the n-type transistor Mn4. Under this circumstance, the connecting device 712 is a resistive element, and the connecting device 714 is a short circuit element. That is, a charging path between the supply voltage Vdd and the node c2 includes the resistive element. Consequently, when the node c2 is in the floating state, the leakage current of the p-type transistors Mp4 and Mp5 can be reduced. Since the voltage rise of the node c2 is slowed down, the D-type flip-flop 710 can be operated correctly.

Please refer to FIG. 7C. In the D-type flip-flop 710, the driving strength of the p-type transistors Mp4 and Mp5 is designed to be weaker than the driving strength of the n-type transistor Mn4. Under this circumstance, the connecting device 712 is a short circuit element, and the connecting device 714 is a resistive element.

In an embodiment, the short circuit element is implemented with a metal wire, and the resistive element is a polysilicon resistor or any other appropriate electronic component. Some examples will be described as follows.

FIGS. 8A, 8B, 8C, 8D, 8E and 8F schematically illustrate some examples of the resistive element used in the D flip-flop according to the third embodiment of the present invention.

Figure 8A:
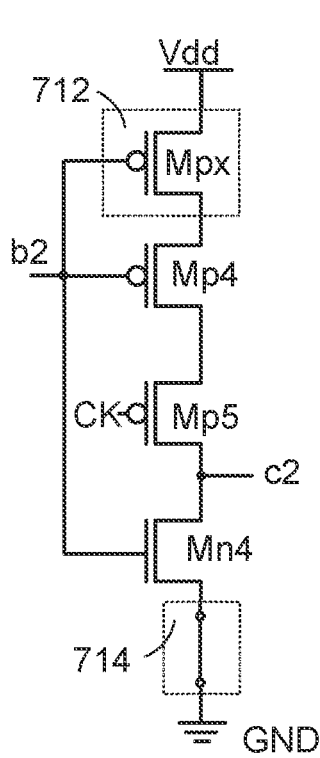
FIGS. 8A, 8B, 8C, 8D, 8E and 8F schematically illustrate some examples of the resistive element used in the D flip-flop according to the third embodiment of the present invention.
Figure 8B:
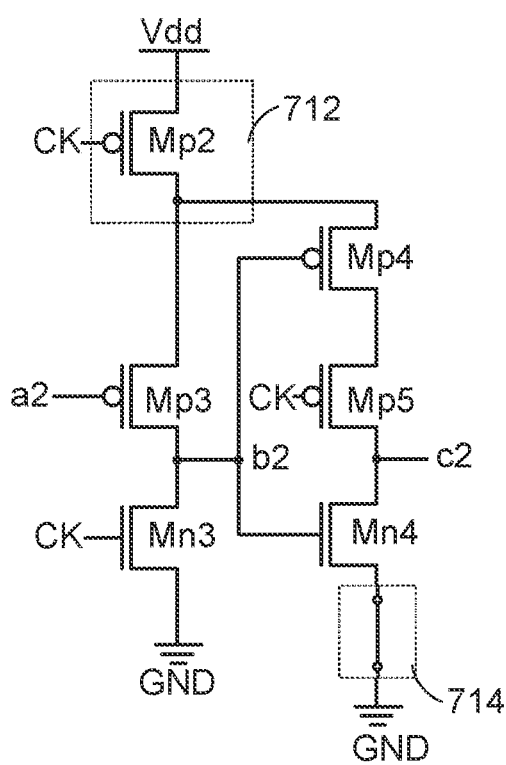

Please refer to FIG. 8A. In the third stage, the connecting device 712 in the charging path between the supply voltage Vdd and the node c2 comprises a p-type transistor Mpx. The gate terminal of the p-type transistor Mpx is connected to the node b2. The first drain/source terminal of the p-type transistor Mpx receives the supply voltage Vdd. The second drain/source terminal of the p-type transistor Mpx is connected with the first drain/source terminal of the p-type transistor Mp4.

In another embodiment, the resistive element as shown in FIG. 8A (i.e., the p-type transistor Mpx) may be replaced by the p-type transistor Mp2 of the second stage. Please refer to FIG. 8B. In the third stage, the connecting device 712 in the charging path between the supply voltage Vdd and the node c2 comprises the p-type transistor Mp2. The gate terminal of the p-type transistor Mp2 receives the clock signal CK. The first drain/source terminal of the p-type transistor Mp2 receives the supply voltage Vdd. The second drain/source terminal of the p-type transistor Mp2 is connected with the first drain/source terminal of the p-type transistor Mp4.

Figure 8C:
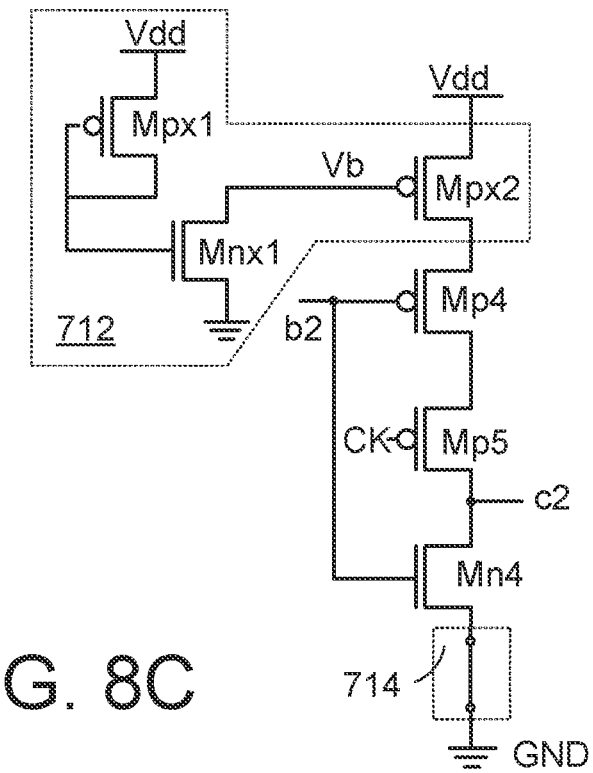

Please refer to FIG. 8C. In the third stage, the connecting device 712 in the charging path between the supply voltage Vdd and the node c2 comprises P-type transistors Mpx1, Mpx2 and an n-type transistor Mnx1. The p-type transistor Mpx1 and the n-type transistor Mnx1 are collaboratively formed as a bias circuit to provide a bias voltage Vb to the gate terminal of the p-type transistor Mpx2. The first drain/source terminal of the p-type transistor Mpx1 receives the supply voltage Vdd. The gate terminal of the p-type transistor Mpx1 and the second drain/source terminal of the p-type transistor Mpx1 are connected with each other. The gate terminal of the n-type transistor Mnx1 is connected with the gate terminal of the p-type transistor Mpx1. The first drain/source terminal of the n-type transistor Mnx1 generates the bias voltage Vb. The second drain/source terminal of the n-type transistor Mnx1 receives the supply voltage GND. The gate terminal of the p-type transistor Mpx2 receives the bias voltage Vb. The first drain/source terminal of the p-type transistor Mpx2 receives the supply voltage Vdd. The second drain/source terminal of the p-type transistor Mpx2 is connected with the first drain/source terminal of the p-type transistor Mp4.

Figure 8D:
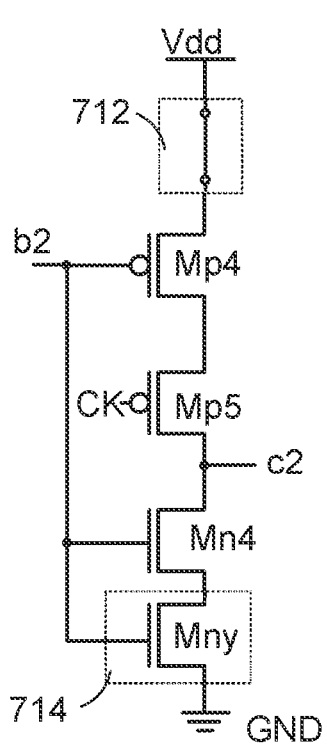
Figure 8E:
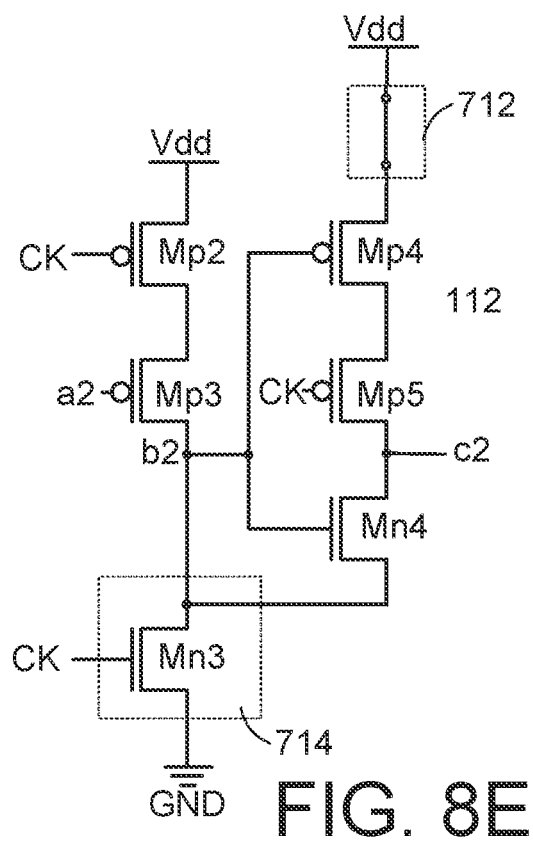

Please refer to FIG. 8D. In the third stage, the connecting device 714 in the discharging path between the node c2 and the supply voltage GND comprises an n-type transistor Mny. The gate terminal of the n-type transistor Mny is connected to the node b2. The first drain/source terminal of the n-type transistor Mny is connected with the second drain/source terminal of the n-type transistor Mn4. The second drain/source terminal of the n-type transistor Mny receives the supply voltage GND.

In another embodiment, the resistive element as shown in FIG. 8D (i.e., the n-type transistor Mny) may be replaced by the n-type transistor Mn3 of the second stage. Please refer to FIG. 8E. In the third stage, the connecting device 714 in the discharging path between the node c2 and the supply voltage GND comprises the n-type transistor Mn3. The gate terminal of the n-type transistor Mn3 receives the clock signal CK. The first drain/source terminal of the n-type transistor Mn3 is connected with the second drain/source terminal of the n-type transistor Mn4. The second drain/source terminal of the n-type transistor Mn3 receives the supply voltage GND.

Figure 8F:
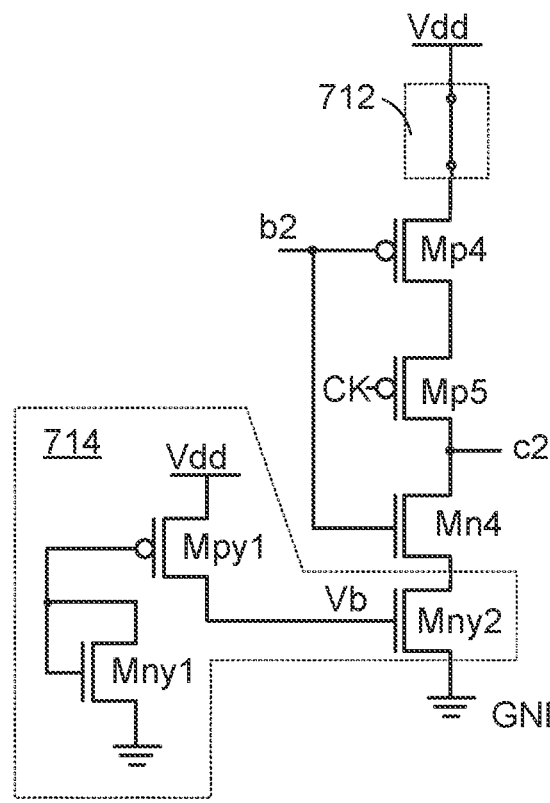

Please refer to FIG. 8F. In the third stage, the connecting device 714 in the discharging path between the node c2 and the supply voltage GND comprises n-type transistor Mny1, Mny2 and a p-type transistor Mpy1. The p-type transistor Mpy1 and the n-type transistor Mny1 are collaboratively formed as a bias circuit for providing a bias voltage Vb to the gate terminal of the n-type transistor Mny2. The first drain/source terminal of the p-type transistor Mpy1 receives the supply voltage Vdd. The second drain/source terminal of the p-type transistor Mpy1 generates the bias voltage Vb. The gate terminal of the n-type transistor Mny1 is connected with the gate terminal of the p-type transistor Mpy1. The gate terminal of the n-type transistor Mny1 and the first drain/source terminal of the n-type transistor Mny1 are connected with each other. The second drain/source terminal of the n-type transistor Mny1 receives the supply voltage GND. The gate terminal of the n-type transistor Mny2 receives the bias voltage Vb. The first drain/source terminal of n-type transistor Mny2 is connected with the second drain/source terminal of n-type transistor Mn4. The second drain/source terminal of n-type transistor Mny2 receives the supply voltage GND.

Moreover, the circuitry structure of the D flip-flop may be modified according to the concepts of the above three embodiments. For example, in a variant example of the D flip-flop, the first stage comprises two connecting devices and the second stage comprises other two connecting devices. In another variant example of the D flip-flop, the first stage comprises two connecting devices and the third stage comprises other two connecting devices. In another variant example of the D flip-flop, the second stage comprises two connecting devices and the third stage comprises other two connecting devices. In another variant example of the D flip-flop, each of the first stage, the second stage and the third stage comprises two connecting devices.

Figure 9A:
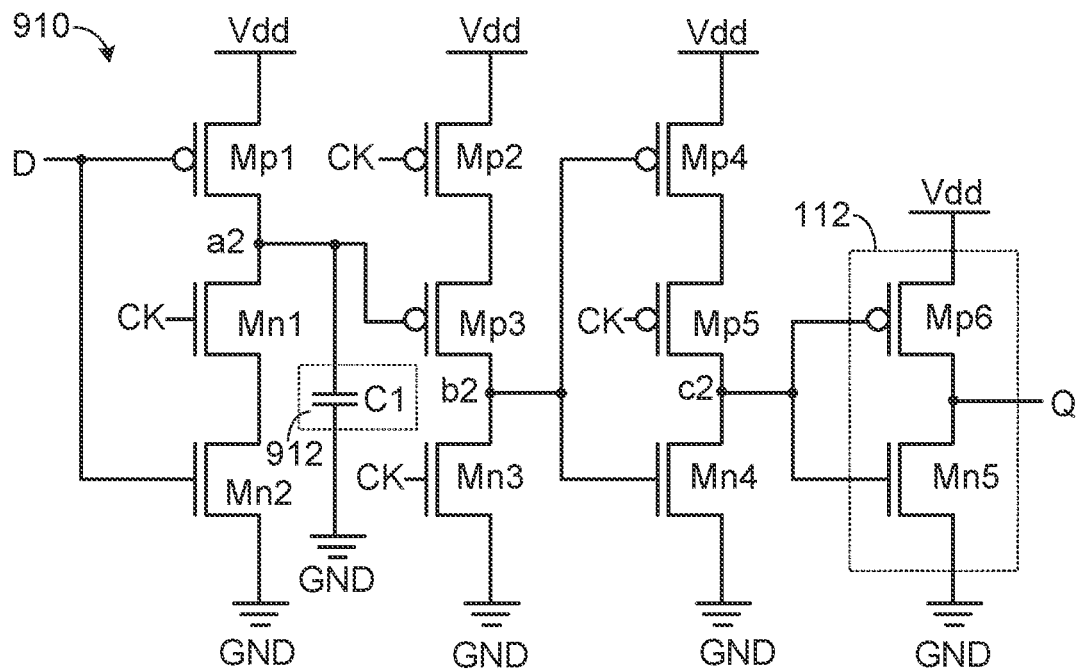
FIGS. 9A and 9B are schematic circuit diagrams illustrating a TSPC D flip-flop according to a fourth embodiment of the present invention.
Figure 9B:
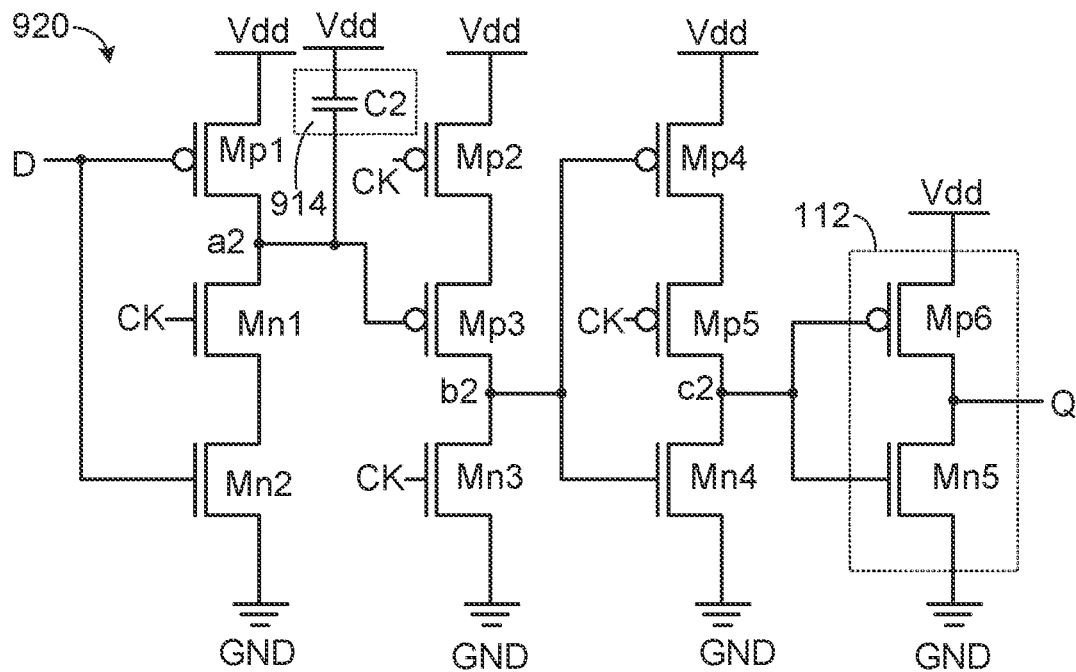

In some embodiments, at least one capacitor is connected to the node a2 to reduce the influence of the Miller effect. FIGS. 9A and 9B are schematic circuit diagrams illustrating a TSPC D flip-flop according to a fourth embodiment of the present invention. In comparison with the negative trigger TSPC D-type flip-flop 110 of FIG. 1A, the TSPC D flip-flop 510 of this embodiment further comprises a capacitor. The capacitor is connected to the node a2. The arrangement of capacitor can reduce the holding time of the input signal D and increase the operation speed of the D flip-flop 510. For succinctness, only the relationship between the capacitor and associated components will be described as follows.

As shown in FIG. 9A, the capacitor 912 of the D flip-flop 910 has a first terminal and a second terminal. The first terminal of the capacitor 912 is connected to the node a2. The second terminal of the capacitor 912 receives the supply voltage GND.

As shown in FIG. 9B, the capacitor 914 of the D flip-flop 920 has a first terminal and a second terminal. The first terminal of the capacitor 914 is connected to the node a2. The second terminal of the capacitor 914 receives the supply voltage Vdd.

Moreover, the circuitry structure of the D flip-flop may be modified according to the concepts of the D flip-flops 910 and 920. For example, in a variant example of the D flip-flop, two capacitors are connected to the node a2. One of the two capacitors is connected between the node a2 and the supply voltage Vdd. The other capacitor is connected between the node a2 and the supply voltage GND.

Preferably but not exclusively, the capacitor used in the D flip-flop of the fourth embodiment is a metal-insulator-metal capacitor (also referred as a MIM capacitor) or any other appropriate electronic component.

FIGS. 10A, 10B, 10C, 10D and 10E schematically illustrate some examples of the capacitor used in the D flip-flop according to the fourth embodiment of the present invention.

Figure 10A:
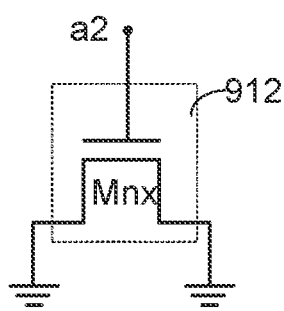
FIGS. 10A, 10B, 10C, 10D and 10E schematically illustrate some examples of the capacitor used in the D flip-flop according to the fourth embodiment of the present invention.

Please refer to FIG. 10A. The capacitor 912 is implemented through an n-type transistor Mnx. The gate terminal of the n-type transistor Mnx is connected to the node a2. The first drain/source terminal and the second drain/source terminal of the n-type transistor Mnx receive the supply voltage GND.

Figure 10B:
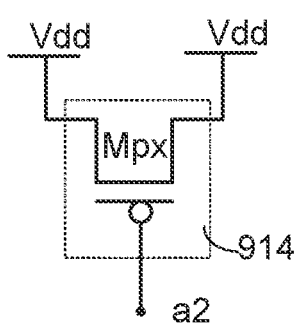

Please refer to FIG. 10B. The capacitor 914 is implemented with a p-type transistor Mpx. The gate terminal of the p-type transistor Mpx is connected to the node a2. The first drain/source terminal and the second drain/source terminal of the p-type transistor Mpx receive the supply voltage Vdd.

Figure 10C:
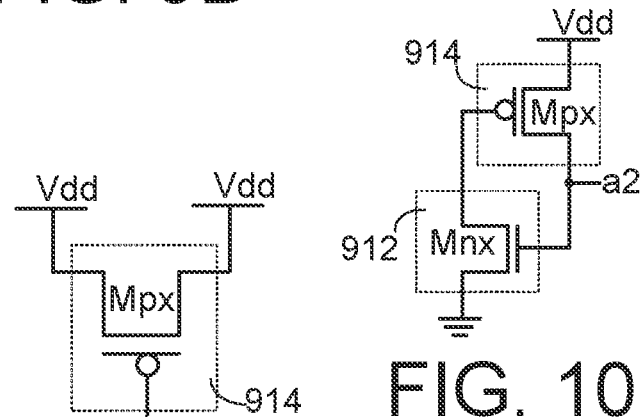

Please refer to FIG. 10C. The two capacitors 912 and 914 are implemented with an n-type transistor Mnx and a p-type transistor Mpx, respectively. The gate terminal of the n-type transistor Mnx is connected to the node a2. The first drain/source terminal and the second drain/source terminal of the n-type transistor Mnx receive the supply voltage GND. The gate terminal of the p-type transistor Mpx is connected to the node a2. The first drain/source terminal and the second drain/source terminal of the p-type transistor Mpx receive the supply voltage Vdd.

Figure 10D:
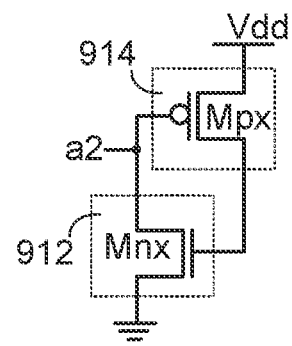

Please refer to FIG. 10D. The two capacitors 912 and 914 are implemented with an n-type transistor Mnx and a p-type transistor Mpx, respectively. The first drain/source terminal of the p-type transistor Mpx receives the supply voltage Vdd. The second drain/source terminal of the p-type transistor Mpx is connected to the node a2. The gate terminal of the n-type transistor Mnx is connected to the node a2. The first drain/source terminal of the n-type transistor Mnx is connected with the gate terminal of the p-type transistor Mpx. The second drain/source terminal of the n-type transistor Mnx receives the supply voltage GND.

Figure 10E:
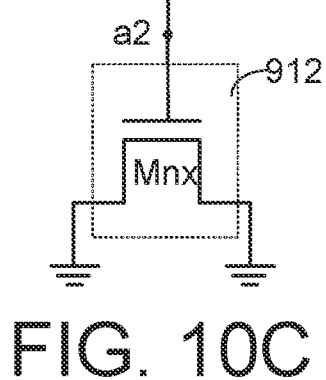

Please refer to FIG. 10E. The two capacitors 912 and 914 are implemented with an n-type transistor Mnx and a p-type transistor Mpx, respectively. The first drain/source terminal of the p-type transistor Mpx receives the supply voltage Vdd. The gate terminal of the p-type transistor Mpx is connected to node a2. The gate terminal of the n-type transistor Mnx is connected with the second drain/source of the p-type transistor Mpx. The first drain/source terminal of the n-type transistor Mnx is connected to node a2. The second drain/source terminal of the n-type transistor Mnx receives the supply voltage GND.

Moreover, the circuitry structure of the D flip-flop in the fourth embodiment may be modified according to the concepts of the above embodiments. For example, in a variant example of the D flip-flop, the first stage comprises two connecting devices, and the capacitor is connected to the second node a2. In another variant example of the D flip-flop, the second stage comprises two connecting devices, and the capacitor is connected to the second node a2. In another variant example of the D flip-flop, the third stage comprises two connecting devices, and the capacitor is connected to the second node a2. In another variant example of the D flip-flop, each of the first connecting device and the second stage comprises two connecting devices, and the capacitor is connected to the second node a2. In another variant example of the D flip-flop, each of the first connecting device and the third stage comprises two connecting devices, and the capacitor is connected to the second node a2. In another variant example of the D flip-flop, each of the second connecting device and the third stage comprises two connecting devices, and the capacitor is connected to the second node a2. In another variant example of the D flip-flop, each of the first connecting device, the second stage and the third stage comprises two connecting devices, and the capacitor is connected to the second node a2.

In the above embodiments, each D flip-flop comprise four stages connected between the input terminal and the output terminal in series. The fourth stage is an inverter. According to the practical requirements, the fourth stage (i.e., the inverter) may be omitted. Under this circumstance, the D flip-flop receives the input signal and generates an inverted output signal according to the clock signal.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A D-type flip-flop, comprising:
a first first-type transistor having a gate terminal, a first drain/source terminal, and a second drain/source terminal, wherein the gate terminal of the first first-type transistor receives an input signal, the first drain/source terminal of the first first-type transistor receives a first supply voltage, and the second drain/source terminal of the first first-type transistor is connected to a first node;
a first second-type transistor having a gate terminal, a first drain/source terminal and a second drain/source terminal, wherein the gate terminal of the first second-type transistor receives a clock signal, and the first drain/source terminal of the first second-type transistor is connected to the first node;
a second second-type transistor having a gate terminal, a first drain/source terminal and a second drain/source terminal, wherein the gate terminal of the second second-type transistor receives the input signal, the first drain/source terminal of the second second-type transistor is connected with the second drain/source terminal of the first second-type transistor, and the second drain/source terminal of the second second-type transistor receives a second supply voltage;
a second first-type transistor having a gate terminal, a first drain/source terminal and a second drain/source terminal, wherein the gate terminal of the second first-type transistor receives the clock signal, and the first drain/source terminal of the second first-type transistor receives the first supply voltage;
a third first-type transistor having a gate terminal, a first drain/source terminal and a second drain/source terminal, wherein the gate terminal of the third first-type transistor is connected to the first node, the first drain/source terminal of the third first-type transistor is connected with the second drain/source terminal of the second first-type transistor, and the second drain/source terminal of the third first-type transistor is connected to a second node;
a third second-type transistor having a gate terminal, a first drain/source terminal and a second drain/source terminal, wherein the gate terminal of the third second-type transistor receives the clock signal, the first drain/source terminal of the third second-type transistor is connected to the second node, and the second drain/source terminal of the third second-type transistor receives the second supply voltage;
a first connecting device having a first terminal and a second terminal, wherein the first terminal of the first connecting device receives the first supply voltage;
a fourth first-type transistor having a gate terminal, a first drain/source terminal and a second drain/source terminal, wherein the gate terminal of the fourth first-type transistor is connected to the second node, and the first drain/source terminal of the fourth first-type transistor is connected to the second terminal of the first connecting device;
a fifth first-type transistor having a gate terminal, a first drain/source terminal and a second drain/source terminal, wherein the gate terminal of the fifth first-type transistor receives the clock signal, the first drain/source terminal of the fifth first-type transistor is connected with the second drain/source terminal of the fourth first-type transistor, and the second drain/source terminal of the fifth first-type transistor is connected to a third node;
a fourth second-type transistor having a gate terminal, a first drain/source terminal and a second drain/source terminal, wherein the gate terminal of the fourth second-type transistor is connected to the second node, and the first drain/source terminal of the fourth second-type transistor is connected to the third node; and
a second connecting device having a first terminal and a second terminal, wherein the first terminal of the second connecting device is connected with the second drain/source terminal of the fourth second-type transistor, and the second terminal of the second connecting device receives the second supply voltage, wherein one of the first connecting device and the second connecting device is a resistive element, and the other of the first connecting device and the second connecting device is a short circuit element.

2. The D-type flip-flop as claimed in claim 1, further comprising an inverter, wherein an input terminal of the inverter is connected to the third node, and an output terminal of the inverter generates an output signal.

3. The D-type flip-flop as claimed in claim 1, wherein the first first-type transistor, the second first-type transistor, the third first-type transistor, the fourth first-type transistor and the fifth first-type transistor are p-type transistors, and the first second-type transistor, the second second-type transistor, the third second-type transistor and the fourth second-type transistor are n-type transistors, wherein the first supply voltage is higher than the second supply voltage.

4. The D-type flip-flop as claimed in claim 1, wherein the first first-type transistor, the second first-type transistor, the third first-type transistor, the fourth first-type transistor and the fifth first-type transistor are n-type transistors, and the first second-type transistor, the second second-type transistor, the third second-type transistor and the fourth second-type transistor are p-type transistors, wherein the second supply voltage is higher than the first supply voltage.

5. The D-type flip-flop as claimed in claim 1, further comprising a capacitor, wherein the capacitor is connected to the first node.

* * * * *